(12) United States Patent
Aweya et al.

(10) Patent No.: US 7,613,268 B2
(45) Date of Patent: Nov. 3, 2009

(54) METHOD AND APPARATUS FOR DESIGNING A PLL

(75) Inventors: James Aweya, Kanata (CA); Delfin Y. Montuno, Kanata (CA); Michel Ouellette, Orleans (CA); Kent Felske, Kanata (CA)

(73) Assignee: Nortel Networks Limited, St. Laurent, Quebec (CA)

( * ) Notice: Subject to any disclaimer, the term of this patent is extended or adjusted under 35 U.S.C. 154(b) by 607 days.

(21) Appl. No.: 11/394,705

(22) Filed: Mar. 31, 2006

(65) Prior Publication Data

US 2006/0242445 A1 Oct. 26, 2006

Related U.S. Application Data

(60) Provisional application No. 60/674,231, filed on Apr. 23, 2005.

(51) Int. Cl.
*H03D 3/24* (2006.01)
(52) U.S. Cl. ...................................... 375/376
(58) Field of Classification Search ............... 375/376; 713/400
See application file for complete search history.

(56) References Cited

U.S. PATENT DOCUMENTS

| | | | |
|---|---|---|---|
| 6,914,489 B2* | 7/2005 | Charlon | 331/16 |
| 6,993,106 B1 | 1/2006 | Momtaz | |
| 7,346,133 B2* | 3/2008 | Tatem, Jr. | 375/344 |
| 7,420,426 B2* | 9/2008 | Herrin et al. | 375/376 |
| 2002/0191728 A1* | 12/2002 | Hafez et al. | 375/376 |

OTHER PUBLICATIONS

International Search Report dated Aug. 21, 2006, from corresponding PCT patent application No. PCT/CA2006/000639.
Abramovitch, "Analysis and Design of a Third Order Phase-Lock Loop" 1988 IEEE pp. 0455-0459.

* cited by examiner

*Primary Examiner*—Khanh C Tran
(74) *Attorney, Agent, or Firm*—Anderson Gorecki & Manaras LLP

(57) ABSTRACT

A method and apparatus for designing a PLL enables initial component characteristics and design specifications of the PLL to be specified. Time constants for a loop filter that would be required to create a PLL having the desired design specifications and component characteristics are then computed. The performance or behavior characteristics of the PLL may then be computed for the PLL given the time constants and the initial set of components, to determine whether the performance of the PLL would be considered satisfactory. For example, PLL design software may determine whether a PLL would be sufficiently stable if it was to be created using the particular selected components given the required design specifications. Where the PLL does not meet particular behavior characteristics, the PLL design software may provide guidance as to what component characteristics would improve performance of the PLL. Designed PLLs may be used for timestamp based clock synchronization.

21 Claims, 12 Drawing Sheets

Figure 4
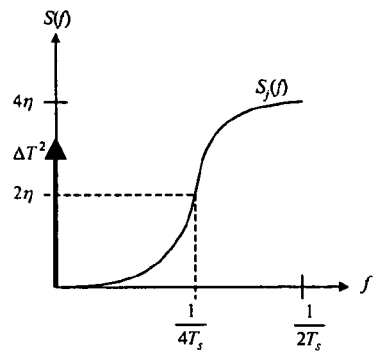
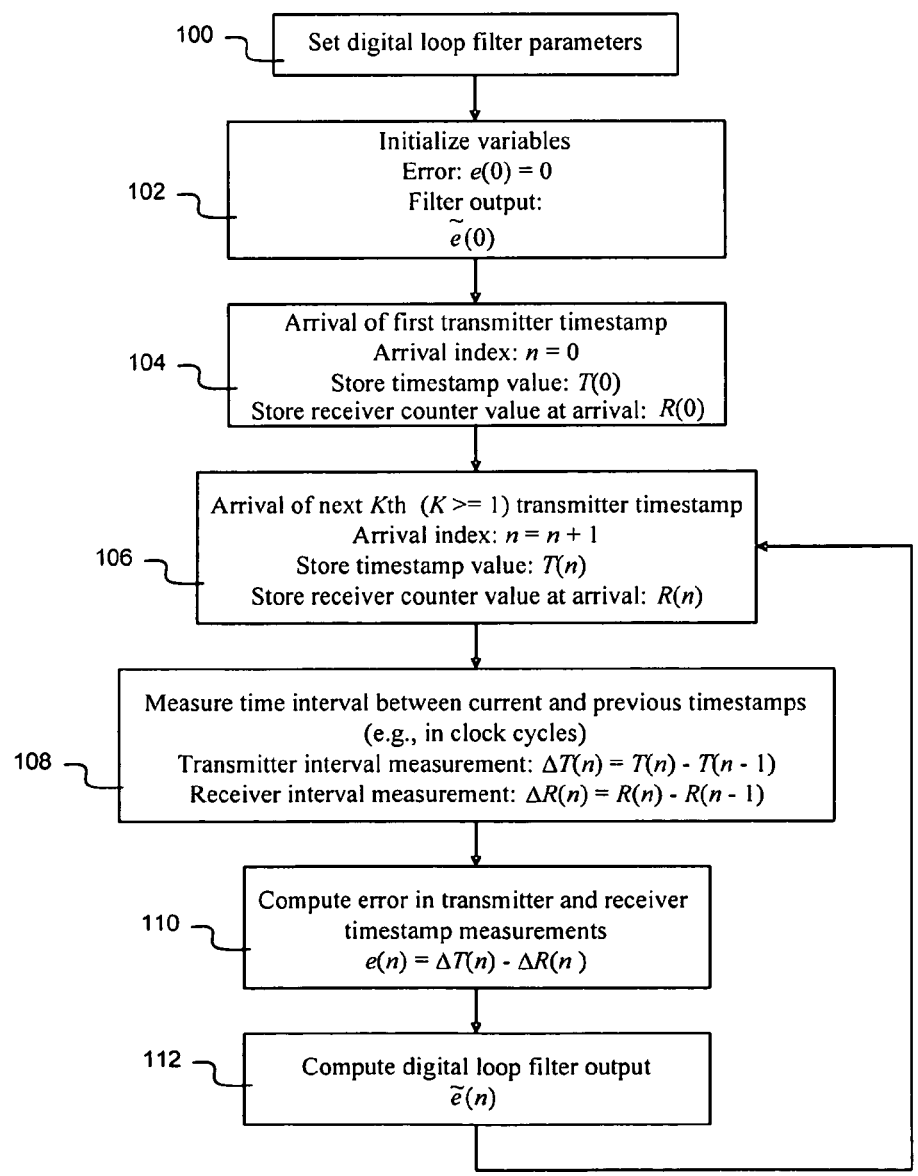
Figure 5

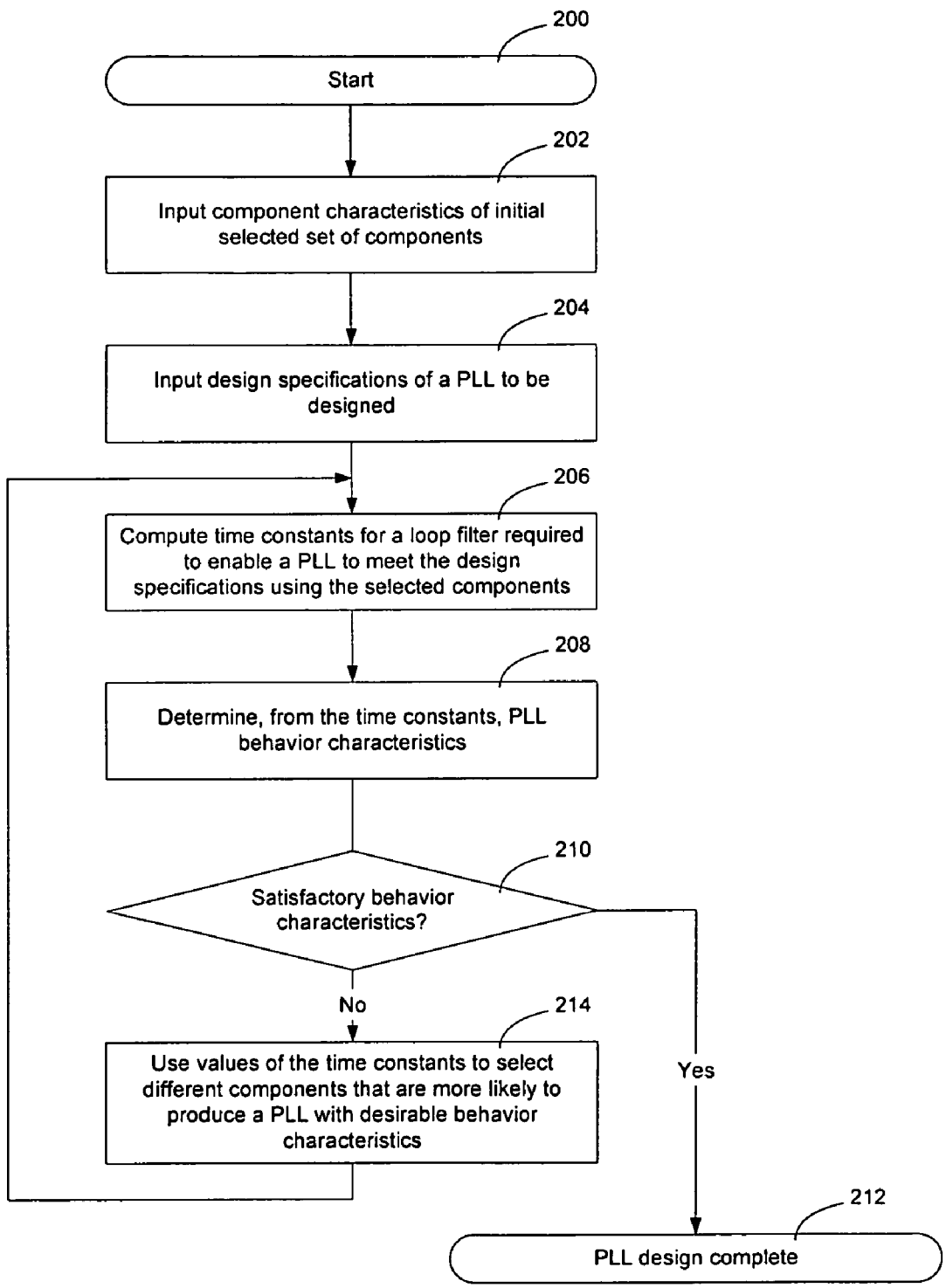

METHOD AND APPARATUS FOR DESIGNING A PLL

CROSS REFERENCE TO RELATED APPLICATIONS

This application claims the benefit of U.S. Provisional Application No. 60/674,232, filed Apr. 23, 2005, entitled Timestamp-Based Technique for Clock Synchronization in Packet Networks, and is also related to U.S. patent application Ser. No. 10/076,415, filed Apr. 19, 2002, entitled Technique for Synchronizing Clocks in a Network, the content of each of which is hereby incorporated herein by reference.

BACKGROUND OF THE INVENTION

1. Field of the Invention

The present invention relates to communication networks and, more particularly, to a method and apparatus for designing a Phase-Locked Loop (PLL).

2. Description of the Related Art

Data communication networks may include various computers, servers, routers, switches, hubs, proxies, and other devices coupled to and configured to pass data to one another. These devices will be referred to herein as "network elements." Data is communicated through the data communication network by passing data over an established circuit or by packetizing the data and routing the data packets between a series of network elements over the network.

There are two basic types of networks—Time Division Multiplexed (TDM) networks and packet networks. These two networks differ in how data are transmitted on the physical medium. In a TDM network, data belonging to different users are assigned different timeslots, otherwise called "circuits" or "channels" in a given time interval otherwise called a "frame". A user can only transmit in its assigned time slot in a frame that continuously repeats itself. The clocking or timing signal that generates the frames and timeslots on the physical medium has to be very accurate for transmissions to be successful. Thus, in a TDM network, the network elements rely on accurate timing to determine which user data belong to which circuit, whereas in a packet network the packets are individually addressed in a manner that is able to be understood by the network elements. Since TDM networks rely on accurate timing to divide frames between multiple logical channels in existence on the same physical wire/optical fiber, timing requirements of TDM networks are generally relatively stringent. In a packet network, by contrast, timing is less important since each packet of data is self-contained and is able to specify to the network element its size and other associated parameters. Since timing is not as stringent on a packet network, the network elements on a packet network are generally not synchronized to a common timing source. Hence, packet networks are generally referred to as asynchronous networks.

TDM networks are synchronous in nature. Consequently, the equipment connected to a TDM network has to be synchronized to it in some manner. In a TDM network, a timing distribution network typically will link the TDM nodes to provide a synchronization signal that is traceable to a Primary Reference Source (PRS). The network synchronization signal is derived from the PRS and distributed through a hierarchy of network nodes with lesser stratum clocks. An alternative timing solution is to maintain a distributed PRS architecture, where for example, each TDM node is timed from an accurate timing source, such as a PRS/Stratum 1 clock, Global Positioning System (GPS) based clock, or a standalone accurate clock (e.g., H Maser, Cesium, Rubidium, etc.). The particular timing requirements on a service interface depend on the services (T1, E1, T3, E3, etc.) carried over the network, which are typically specified in a standard promulgated for that particular service type.

As packet technology has increased in reliability and sophistication, the cost of deploying packet-based networks such as Ethernet networks and Internet Protocol (IP) networks has dropped to the point where it is often cheaper to deploy a packet network than to deploy a TDM network. To take advantage of the lower costs of packet network technology, service providers have sought to implement packet-based core networks intermediate existing TDM networks. To allow a packet network to carry TDM traffic, the packet network must essentially behave as a transparent "link" in the end-to-end connection. The transparent inclusion of a packet network in an end-to-end path of a connection that carries circuit-switched time sensitive traffic is commonly referred to as "circuit emulation" on the packet network.

The non-synchronous nature of the packet network and the packetizing and depacketizing processes used to format the data for transmission over the packet network all contribute to increased delay and delay variations in the transmission of packets, which makes transfers of synchronization between the TDM networks on either side of the packet core difficult. Additionally, while packet networks are able to carry traffic between the end TDM networks, they do not naturally carry accurate clock information due to their asynchronous nature. Thus, to enable TDM traffic to be carried over a packet network, it is necessary to have the end systems directly exchange clock information, so that the data ports on the network elements can be synchronized and to allow the different networks to be synchronized.

To overcome the inherent non-synchronous nature of a packet network, a network element or a downstream terminal mode may use an adaptive timing technique to reconstruct the timing signal of the upstream TDM terminal. For example, where there are no reference clocks traceable to a PRS, a receiving TDM terminal node has to use an adaptive timing technique to reconstruct the timing signal of the transmitting TDM terminal. In an adaptive clocking technique, the TDM receiver derives an estimate of the transmitter clock from the received data stream. This is commonly done using a phase-locked loop (PLL) that slaves the receiver clock to a transmitter clock. The slave PLL is able to process transmitted clock samples encoded within the data stream, or process data arrival patterns, to generate timing signals for the receiver. The purpose of the slave PLL is to estimate and compensate for the frequency drift occurring between the oscillators of the transmitter clock and the receiver clock.

Several adaptive timing techniques have been developed, including extracting clock information from arrival patterns over the network, observing the rate at which the buffers are being filled, and using encoded timing signals transmitted from the upstream terminal to the downstream terminal across the packet network. One example of the use of encoded timing signals (timestamps) is described in U.S. patent application Ser. No. 10/076,415, entitled "Technique for Synchronizing Clocks in a Network", the content of which is hereby incorporated by reference.

In this previous application, a PLL was developed that included a low-pass filter, however the PLL in that solution was not developed quantitatively, but rather was developed by experimental trials. To increase the performance of the PLL, such as to increase the jitter attenuation, a higher order PLL may be used at the slave clock. However, as the order of the PLL increases, such as where second and third order PLLs are to be used to increase the jitter attenuation performance of the PLL, designing a PLL by experimental trials becomes increasingly difficult and cumbersome. Accordingly, it would be advantageous to provide a software program configured to assist in the design of a PLL given a set of performance specifications, (e.g., system damping factor, etc.) and component characteristics (such as VCO characteristic curve, digital-to-analog (DAC) word size (in bits), etc.).

SUMMARY OF THE INVENTION

The present invention overcomes these and other drawbacks by providing a method and apparatus for designing a timestamp-based phase-locked loop for clock synchronization in a packet network. According to an embodiment of the invention, PLL design software is provided that is configured to enable initial component characteristics to be specified, enable design specifications of the PLL to be specified, and to compute the time constants for a loop filter that would be required to enable a PLL to meet the design specifications given the component characteristics. The performance or behavior characteristics of the PLL may then be computed for the PLL given the time constants and the initial set of components to determine whether the performance of the PLL would be considered satisfactory. For example, the PLL design software may determine whether the PLL would be sufficiently stable if created using the particular selected components given the required design specifications. Where the PLL does not meet particular behavior characteristics, the PLL design software may provide guidance as to what component characteristics would improve performance of the PLL. Once the PLL is designed, the PLL design may be implemented in hardware to form a PLL. The PLL design software is particularly useful in designing timestamp-based PLLs for clock synchronization in a packet network.

BRIEF DESCRIPTION OF THE DRAWINGS

Aspects of the present invention are pointed out with particularity in the appended claims. The present invention is illustrated by way of example in the following drawings in which like references indicate similar elements. The following drawings disclose various embodiments of the present invention for purposes of illustration only and are not intended to limit the scope of the invention. For purposes of clarity, not every component may be labeled in every figure. In the figures:

FIG. 4 is a graph illustrating the power spectrum of an output signal of a PLL;

FIG. 5 is a flow chart illustrating a process of synchronizing clocks on a network using timestamps;

FIG. 15 is a flowchart illustrating a process of designing a PLL according to an embodiment of the invention.

DETAILED DESCRIPTION

The following detailed description sets forth numerous specific details to provide a thorough understanding of the invention. However, those skilled in the art will appreciate that the invention may be practiced without these specific details. In other instances, well-known methods, procedures, components, protocols, algorithms, and circuits have not been described in detail so as not to obscure the invention.

Figure 1:
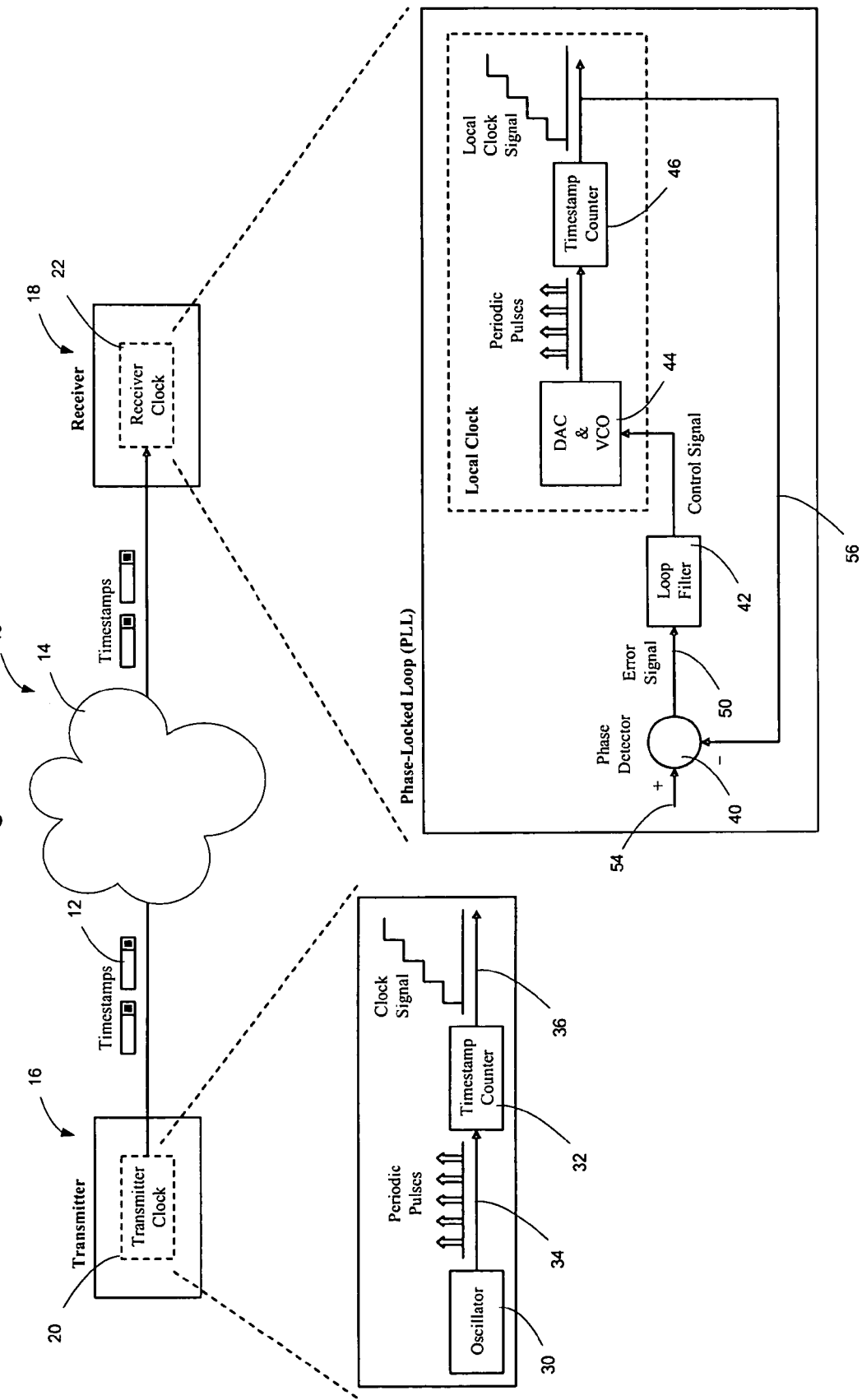
FIG. 1 is a functional block diagram of an example communication network over which clock synchronization may take place using a PLL designed using the PLL design software according to an embodiment of the invention.

FIG. 1 illustrates an example network 10 in which clock information 12 is carried across a packet network 14 from a master clock 16 to one or more slave clocks 18. As shown in FIG. 1, synchronization of the master and slave clocks is achieved over a packet (non TDM) portion of the network 14 by transmitting packets 12 containing clock state information from the master clock 16 to the slave clocks 18.

When timestamps are used for clock synchronization, a transmitter 16 periodically sends explicit time indications, or timestamps, to a receiver 18 to enable the receiver to synchronize its local clock 22 to the transmitter's clock 20. Although FIG. 1 only shows a single receiver, the timestamp synchronization strategy also allows multiple receivers, for example in a broadcast or point-to-multipoint communication scenario, to synchronize their clocks to the transmitter.

The transmitter clock includes an oscillator 30 and a pulse counter 32. The oscillator issues periodic pulses 34 that form the input to the pulse (timestamp) counter 32. The output of the counter 32 represents the transmitter clock signal 36, and is incremented by a fixed amount at each pulse. Samples of the transmitter clock signal are communicated to the receiver 18 as timestamps.

The receiver clock 22 is formed as a Phase-Locked Loop (PLL) which uses the timestamps 12 (which form the PLL reference signal) to lock onto the transmitter clock 20. The PLL 22 has four main components: a phase detector 40, a loop filter 42, a local oscillator such as a Voltage Controlled Oscillator (VCO) or Current Controlled Oscillator (CCO) 44, and a timestamp counter 46. Although an embodiment of the invention will be described in connection with designing a PLL that uses a VCO, the invention is not limited in this manner as a CCO may be used in the design process as well. The phase detector 40 computes an error signal 50 as the difference between a reference signal 54 and the output signal of the PLL 56. The error signal 50 is passed on to the loop filter 42 which is responsible for eliminating possible jitter and noise in the input signal. The local oscillator such as the VCO 44, which typically has a center frequency, oscillates at a frequency which is determined by the output signal of the loop filter.

Figure 2:
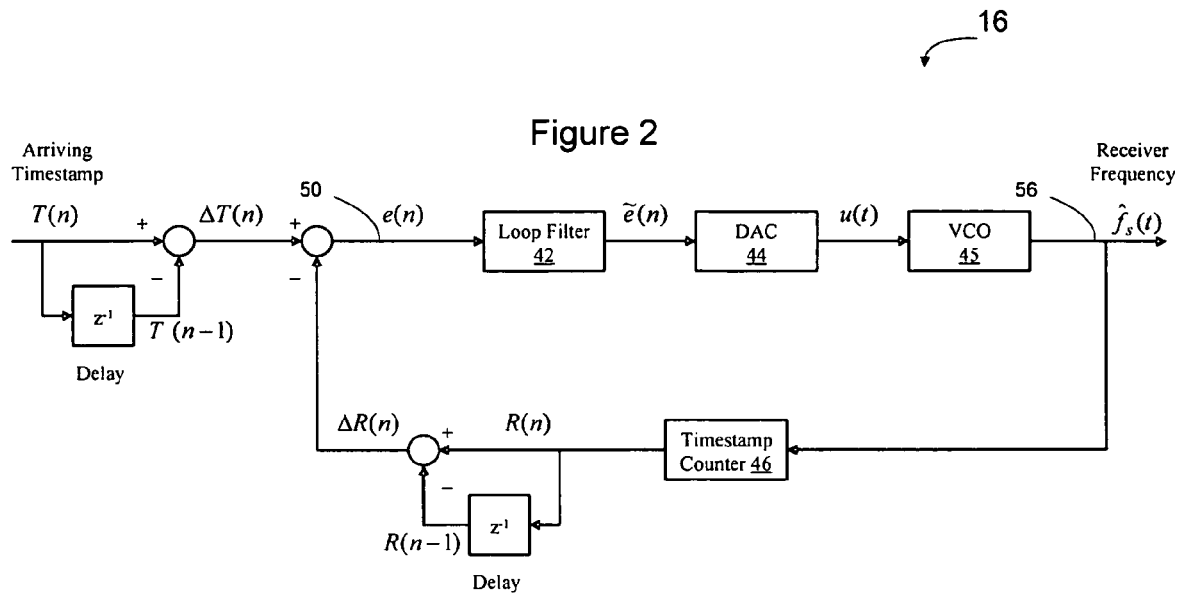
FIG. 2 is a functional block diagram of a PLL configured to use timestamps.

FIG. 2 shows an example of a PLL configured to use a timestamps as an input. In this PLL, T(n) will be used to denote the time base (e.g., in clock ticks) of the transmitter and R(n) will be used to denote the time base of the receiver. These two functions correspond to the timestamps of the two clocks at discrete time instants n, n=0, 1, 2 , . . . . When timestamps are transmitted over the packet network, they will arrive at the receiver with variable delay. If d(n) and d(n−1) denote the delay experienced by the nth and (n−1)th timestamp at the receiver, respectively, then the delay variation induced by the network is given as j(n)=d(n)−d(n−1). The timestamp difference between the nth and (n−1)th generated timestamp at the transmitter is defined as ΔT(n)=T(n)−T(n−1). At the receiver, the timestamp difference between the nth and n−1th timestamp arrivals as measured by the receiver clock is defined as ΔR(n)=R(n)−R(n−1). Note that the timestamp difference measured by the receiver includes the delay variation experienced between the two arrivals, that is, ΔR(n)=ΔT(n)+j(n). If there is zero delay variation and the transmitter and receiver have the same frequency, then ΔR(n)=ΔT(n).

Now the clock recovery problem may be formulated as follows: While filtering out delay variation, the receiver clock frequency $\hat{f}_s = 1/\hat{\tau}_s$ 56 is controlled so that the receiver clock measurements ΔR(n) 60 are equal to the transmitter clock timestamp differences ΔT(n). The difference between ΔT(n) and ΔR(n) forms an error signal, e(n)=ΔT(n)−ΔR(n) (50). This error signal 50 is filtered by the loop filter 42 of a PLL whose output then controls the frequency $\hat{f}_s = 1/\hat{\tau}_s$ of the VCO 45 of the receiver clock as shown in FIG. 2. The function of the PLL is to control the receiver clock frequency $\hat{f}_s$ such that the error e goes to zero at which point the receiver frequency equals the transmitter frequency $f_s$. The loop filter 42, in this PLL, is a simple low-pass filter.

Figure 3:
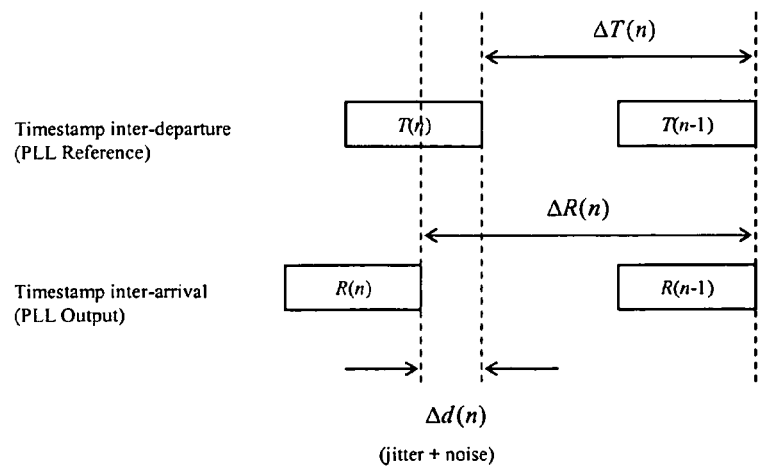
FIG. 3 is a graph illustrating the PLL input and output.

The PLL at the receiver therefore takes ΔT(n) as its reference input and generates ΔR(n) as its output (i.e., the controlled process). The two process variables ΔT(n) and ΔR(n) are illustrated in FIG. 3.

To create a PLL, it is necessary to select components that will provide the PLL with the desired characteristics and responsiveness. One way to do this is to select the components by iterative experimentation. For example, components may be selected, a loop filter designed, and the PLL may be tested to determine its responsiveness and stability characteristics. While this may be possible for lower order PLLs, such as first order PLLs, successfully designing a second or third order PLL may take significant experience and skill on the part of the designer, since it is not always clear how changing one of the components will affect the overall behavior of the PLL. To improve on this manual process, according to an embodiment of the invention, PLL design software is provided that is configured to automate the process of designing the PLL, given a set of performance specifications and component characteristics.

To understand how the PLL design software is configured to perform PLL design, it is first necessary to understand how the components of a PLL interoperate with each other and to understand the manner in which the PLL operates.

To explain why a suitably chosen low-pass filter is required as the loop filter, consider the expression ΔR(n)=ΔT(n)+j(n), where j(n)=d(n)−d(n−1), as developed earlier. The network delays d(n) are assumed to be independent identically distributed (i.i.d) random variables with mean $\mu_d$ and variance $\sigma_d^2$. The delay variation process j(n) has a mean of $\mu_j = E[j(n)] = 0$ and its autocorrelation $R_j(k)$ is given by $$R_j(k) = E[j(n+k)j(n)] \quad (1)$$
$$= E[d(n+k)d(n)] - E[d(n+k)d(n-1)] -$$
$$E[d(n+k-1)d(n)] + E[d(n+k-1)d(n-1)]$$
$$= 2R_d(k) - R_d(k+1) - R_d(k-1)$$
$$= \begin{cases} 2(\sigma_d^2 + \mu_d^2), & k = 0 \\ -(\sigma_d^2 + \mu_d^2), & k = \pm 1 \\ 0, & \text{otherwise} \end{cases}$$

The power spectral density $S_j(f)$ of j(n) is given by $$S_j(f) = \sum_{k=-1}^{1} R_j(k) e^{-i2\pi fk} \quad (2)$$
$$= \eta(2 - e^{i2\pi f} - e^{-i2\pi f})$$
$$= 2\eta(1 - \cos 2\pi f),$$

where $\eta = \sigma_d^2 + \mu_d^2$. Without loss of generality, it will be assumed that the transmitter generates timestamps with a constant interval of ΔT (i.e., ΔT is constant for all n). Then the z-transform and the power spectral density of ΔR(n) are given by $$\Delta R(z) = \Delta T + j(z) \quad (3)$$

$$S_{\Delta R}(f) = \Delta T^2 \delta(f) + S_j(f) = \Delta T^2 \delta(f) + 2\eta(1 - \cos 2\pi f T_s), \quad (4)$$

note that these equations have used the fact that the Fourier transform of a constant is a delta function and $T_s$ is the sampling, which in this case is equal to the inter-timestamp period ΔT. The power spectral density $S_{\Delta R}(f)$, which is shown in FIG. 4, contains a dc component equal to the timestamp generation interval and the spectrum of the delay variation process.

Because the delay variation and noise contribution at dc is zero, theoretically, by using an appropriate low-pass filter to remove the delay variation and noise in the high-frequency region, the period (frequency) of timestamp generation can be estimated to an arbitrary degree of accuracy. As set forth in greater detail below, a suitable low pass filter may be designed given certain performance specifications of the PLL according to an embodiment of the invention.

FIG. 5 illustrates a process used by the PLL to control the VCO to estimate the transmitter clock. The measurement/computational instants in the flowchart occur at the timestamp arrival instants at the receiver. Initially, the PLL at the receiver sets the initial digital loop filter parameters (100) and initializes variables (102). The PLL then waits for the first timestamp to arrive (104).

When the first timestamp arrives it is loaded into the counter. From this point onwards, the PLL starts to operate in a closed-loop fashion. Each time the Kth (K≧1, where K is a downsampling parameter) timestamp arrives (106) (i.e., at sampling instant n=1, 2, 3 , . . . ), the difference ΔT(n) between this value T(n) and the value at the previous sampling instant T(n−1) is determined. The difference ΔT(n) is then compared to the timestamp inter-arrival time ΔR(n)=R(n)−R(n−1) measured by the receiver PLL counter (108) to give an error term e(n)=ΔT(n)−ΔR(n) (110). This error term is sent to the loop filter (112) whose output controls the frequency of the VCO. The output of the VCO in turn provides the clock frequency of the receiver and also drives the counter. After a while the error term is expected to converge to zero which means the PLL has been locked to the incoming time base, i.e., time base of the transmitter.

Figure 6:
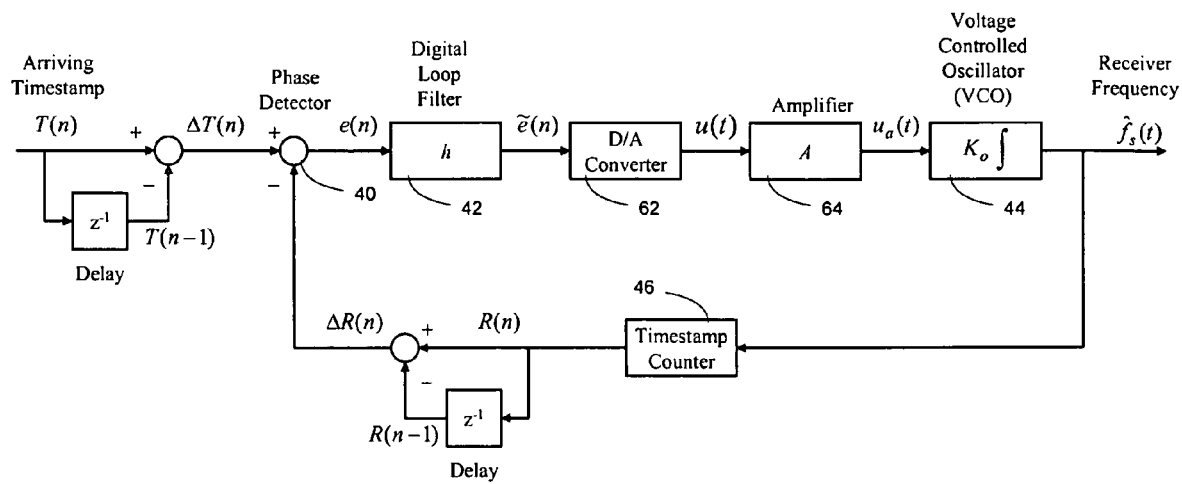
FIG. 6 is a functional block diagram of a PLL implemented using a voltage controlled oscillator.

FIG. 6 shows the basic components of a PLL architecture with a VCO. The phase detector 40 compares an arriving transmitter timestamp difference against the timestamp difference of the receiver clock. The output of the phase detector, called the error, is a measure of the frequency difference between the two clocks. The error is then filtered by the loop filter 42. The signal u is converted to an analog signal using a digital-to-analog converter (DAC) 62. A Zero-Order Hold (ZOH) circuit (implemented separately or as part of the DAC) maintains the same voltage throughout the sample period. The analog voltage is then amplified by an amplifier 64 before being applied to the VCO. The main function of the amplifier, in this example, is to scale the input voltage to the VCO within the acceptable VCO voltage range. The control voltage on the VCO changes the frequency in a direction that reduces the difference between the input frequency and the local oscillator. Note that the minimum frequency resolution of the VCO is dependent on the resolution (quantization step size) of the DAC. Higher resolution of the DAC provides finer frequency control of the VCO. In the synchronized (often called the locked) state, the error between the local oscillator's output signal and the transmitter's signal is zero or remains a very small random quantity.

In some PLL designs, a current-controlled oscillator (CCO) is used instead of the VCO. In this case, the output signal of the DAC is a controlled current source rather than a voltage source. However, the operating principle remains the same.

As discussed above in connection with the general description of a PLL, a PLL is a feedback control system. Assuming that the phase error $\theta_e(\theta_e(t)=\theta_{ref}(t)-\theta_{VCO}(t)$ is the difference between the VCO clock phase $\theta_{VCO}(t)$ and the reference clock phase $\theta_{ref}(t))$ is within a limited range, this feedback control system can be further simplified as linear feedback control system. This assumption is reasonable for most applications since a real PLL has a bounded and limited locking range (expressed in parts-per-million, ppm, of the nominal operating frequency), outside of which locking cannot be guaranteed. The small signal linear analysis for the PLL is therefore useful for studying steady-state equilibrium behavior and stability properties under these same conditions. To enable a PLL to be designed using an automated process such as a computer program, it is first necessary to develop control models for the phase detector, digital to analog converter, voltage controlled oscillator, and given some general structure of the loop filter, the PLL as a whole. The analysis will further provide design procedures for determining the parameters of the loop filter that will meet certain pre-specified design and performance requirements. Some design steps are provided so that those with limited knowledge of control systems can still determine the parameters of the PLL given only the performance specifications.

Figure 7:
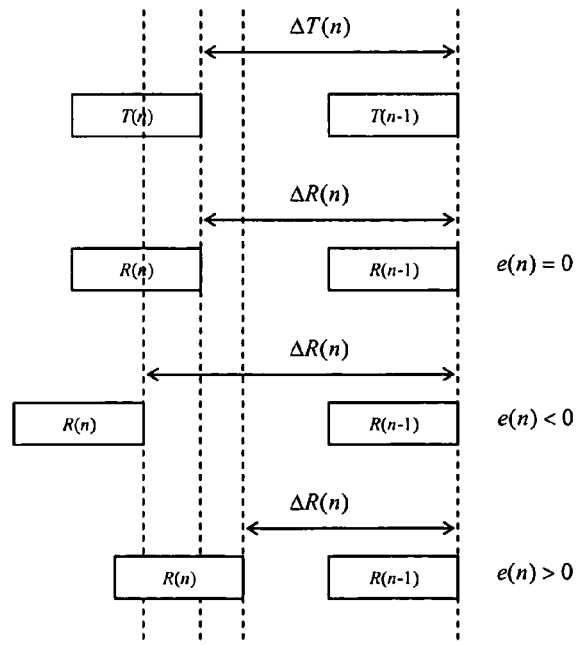
FIG. 7 is a graph illustrating the behavior of a phase detector in the PLL of FIG. 6.
Figure 8:
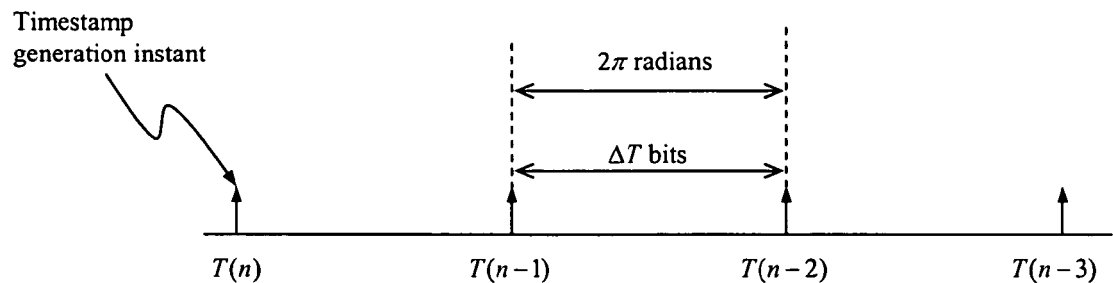
FIG. 8 is a graph illustrating the phase detector signals in both bits and radians.

The behavior of the phase detector is illustrated in FIG. 7. Assume that the timestamp generation period is constant, that is, $\Delta T(n)=\Delta T$ and that there is no delay variation in the system. The phase detector will determine a phase error approximately every $\Delta T(n)$ (bit) interval. In the PLL, essentially, the input frequencies $f_s$ and $f_s$ are essentially divided down to lower frequencies which we denote as $f_{\Delta T}=f_s/\Delta T$ and $f_{\Delta R}=f_s/\Delta R$, respectively, before being passed to the phase detector. In this case, measurements and control are done every $\Delta T$ interval, thus, $\Delta T$ tick is equivalent to $2\pi$ radians. FIG. 8 shows this relationship. Note that in a PLL, if measurements and control are done on a bit-by-bit basis, an error of 1 clock tick is equivalent to $2\pi$ radians. This is also analogous to the case of observing an error of 1 bit off a threshold in an elastic-buffer type PLL, where errors are measured in bits or fractions of a bit around a buffer threshold.

Therefore, given an error e(t) in bits and a phase error $\theta_e(t)$ in radians, the following may be used to express the bit error-phase error relationship:

$$\frac{e(t)}{\Delta T} = \frac{\theta_e(t)}{2\pi}, \tag{5}$$

or $$e(t) = \frac{\Delta T}{2\pi} \cdot \theta_e(t).$$

With this, it is possible to write the phase detector gain as $$K_{PD} = \frac{\Delta T}{2\pi}. \tag{6}$$

Figure 9:
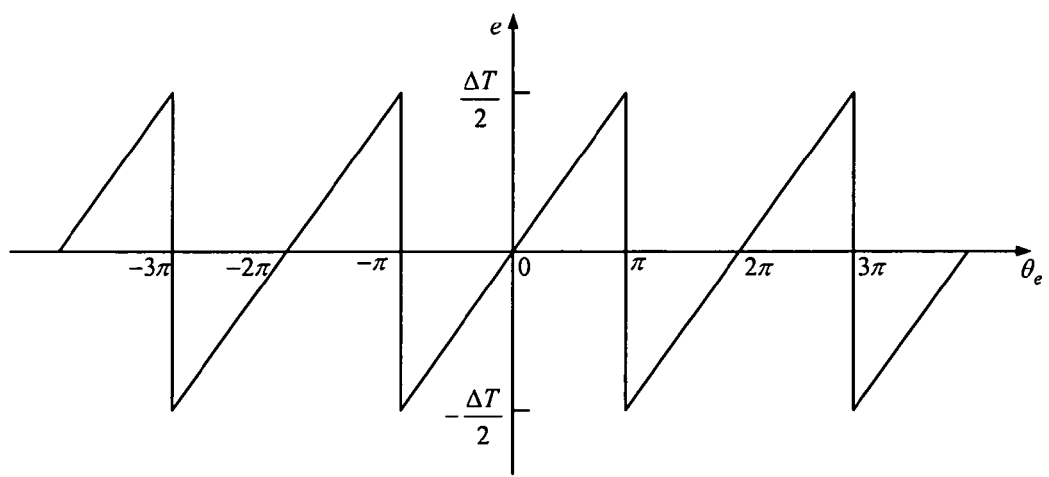
FIG. 9 is a graph illustrating the phase detector characteristics over time.

The phase detector characteristic curve is shown in FIG. 9. As shown in FIG. 9, the phase detector gain is equal to the slope of its characteristic curve.

It is reasonable to assume that the PLL is operating in the continuous-time domain. In this domain, the phase detector measures the phase difference $\theta_e(t)=\theta_{ref}(t)-\theta_{VCO}(t)$ between the VCO clock phase $\theta_{VCO}(t)$ and the reference clock phase $\theta_{ref}(t)$, and develops an output e(t) that is proportional to this phase-frequency difference $\theta_e(t)$. The ranges of $\theta_e(t)$ are $-\pi<\theta_e(n)<\pi$. This operation can be expressed as $$e(t)=K_{PD}\cdot\theta_e(t) \tag{7}$$

The error signal output e(t) is then passed to the loop filter $G_{LF}(s)$ to be processed into the filtered error $\tilde{e}(t)$. The transfer function of the phase detector may then be given as:

$$G_{PD}(s) = \frac{E(s)}{\Theta_e(s)} = K_{PD} = \frac{\Delta T}{2\pi}, \tag{8}$$

where E(s) and $\Theta_e(s)$ are the Laplace transforms of e(t) and $\theta_e(t)$, respectively.

The Digital to Analog Converter (DAC) and the Voltage Controlled Oscillator (VCO) determine the accuracy of the PLL. To model these components, the following variables are defined:

u(t)=DAC output voltage (in volts)
$\Delta V_{DAC}$=DAC output voltage range (which is also the VCO input voltage range)
$DAC_{res}$=DAC resolution=$2^L$, where L is the DAC register length in bits, e.g., L=12 bits Thus, given a filtered error value $\tilde{e}(t)$, the DAC produces a voltage according to the following formula:

$$u(t) = \frac{\Delta V_{DAC}}{DAC_{res}} \cdot \tilde{e}(t). \tag{9}$$

The above equation means that the VCO input voltage range $\Delta V_{DAC}$ is quantized into $DAC_{res}$ values. Assuming in this equation that the error value $\tilde{e}(t)$ is expressed as an integer number 0 to $DAC_{res}-1$, the Laplace transform of the expression is given as $$U(s) = \frac{\Delta V_{DAC}}{DAC_{res}} \cdot \tilde{E}(s), \quad (10)$$

which yields the DAC transfer function:

$$G_{DAC}(s) = \frac{U(s)}{\tilde{E}(s)} = \frac{\Delta V_{DAC}}{DAC_{res}}, \quad (11)$$

where $\tilde{E}(s)$ and $U(s)$ are the Laplace transforms of $\tilde{e}(t)$ and $u(t)$, respectively.

To obtain a model for the VCO, it will be assumed that the DAC output voltage $u(t)$ does not need any amplification, thus A=1. The VCO oscillates at an angular frequency $\omega_{VCO}(t)$ which is determined by the DAC output voltage $u(t)$. The angular frequency of the VCO $\omega_{VCO}(t)$ is given by $$\omega_{VCO}(t) = \omega_o + K_{VCO} u(t), \quad (12)$$

where $\omega_o = 2\pi f_o$ is the center angular frequency of the VCO (expressed in rad/sec), $f_o$ is the center frequency in Hertz, and $K_{VCO}$ is the VCO gain (in rad/sec-V). The deviation of the VCO from its center frequency is $\Delta\omega_{VCO}(t) = K_{VCO} u(t)$.

By definition the VCO phase $\theta_{VCO}$ is given by the integral over the frequency variation $\Delta\omega = \omega_{VCO}(t) - \omega_o$, that is, $$\theta_{VCO}(t) = \int_0^t \Delta\omega(x)dx = K_{VCO} \int_0^t u(x)dx. \quad (13)$$

Denoting $\Theta_{VCO}(s)$ as the Laplace transform of $\theta_{VCO}(t)$, the Laplace transform of the above expression is given by $$\Theta_{VCO}(s) = \frac{K_{VCO}}{s} U(s), \quad (14)$$

from which the transfer function of the VCO may be obtained as:

$$G_{VCO}(s) = \frac{\Theta_{VCO}(s)}{U(s)} = \frac{K_{VCO}}{s}. \quad (15)$$

This expression shows that the VCO represents a pure integrator for phase signals.

The operation of the PLL is complicated by the fact that it has to track the reference clock and simultaneously reject short term variations. From a functional point of view, the PLL should be able to operate to provide a very stable clock when synchronized to the external network, and should also be able to provide a stable clock when synchronization is lost (holdover mode). In holdover mode the feedback loop is open, and the circuit does not behave as a PLL.

Figure 10:
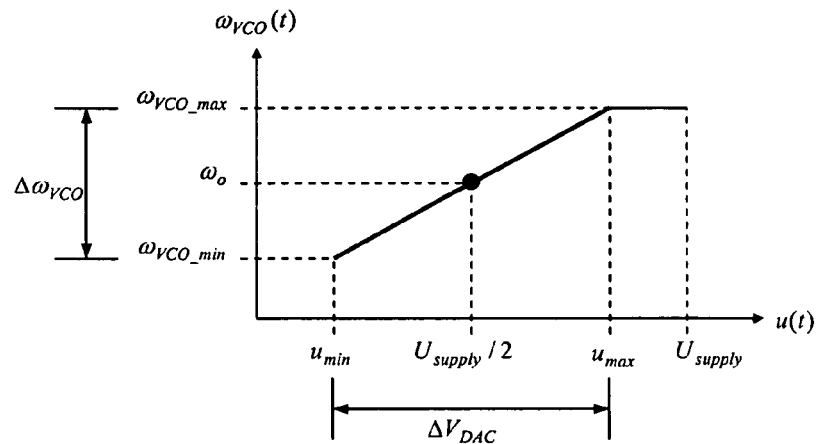
FIG. 10 is a graph illustrating an ideal voltage controlled oscillator characteristic curve.

The gain of the VCO can be computed from the VCO data sheet, which is generally obtainable from the VCO supplier. The first requirement is the determination of the supply voltage(s) of the VCO (this can be determined from the data sheet). For example, the VCO circuit may be able to be powered from a unipolar +5V supply. Let the VCO supply voltage be denoted by $U_{supply}$. The VCO control signal $u(t)$ is usually limited to a range which is smaller than the supply voltage $U_{supply}$. Let $u_{min}$ and $u_{max}$ be the minimum and maximum value allowed for $u(t)$, respectively. With these, the VCO transfer characteristic curve may be described as shown in FIG. 10.

The VCO is required to generate the frequency $\omega_{VCO\_min}$ when $u(t)=u_{min}$, and the frequency $\omega_{VCO\_max}$ when $u=u_{max}$. Now the angular frequency is determined at $u=U_{supply}/2$ which corresponds to a frequency $\omega_o$ that is considered as the center frequency of the PLL (irrespective of the fact that the center frequency could be varying (e.g., due to temperature effects, aging)). From FIG. 10 the VCO gain can be calculated as $$K_{VCO} = \frac{\omega_{VCO\_max} - \omega_{VCO\_min}}{u_{max} - u_{min}} = \frac{\Delta\omega_{VCO}}{\Delta V_{DAC}}. \quad (16)$$

The frequency axis of the VCO characteristics is sometimes expressed in Hertz instead of radians per second. In this case, the gain is obtained as $$K_{VCO} = \frac{2\pi(f_{VCO\_max} - f_{VCO\_min})}{u_{max} - u_{min}} = \frac{2\pi \cdot \Delta f_{VCO}}{\Delta V_{DAC}}. \quad (17)$$

Furthermore, if the frequency axis is expressed in parts-per-million (ppm) of the VCO center frequency, the gain is calculated as $$K_{VCO} = \frac{2\pi \cdot f_0 \cdot \Delta ppm}{\Delta V_{DAC}}, \quad (18)$$

where $f_o$ is the VCO center frequency and $\Delta ppm$ is the VCO output frequency range in ppm.

Figure 11:
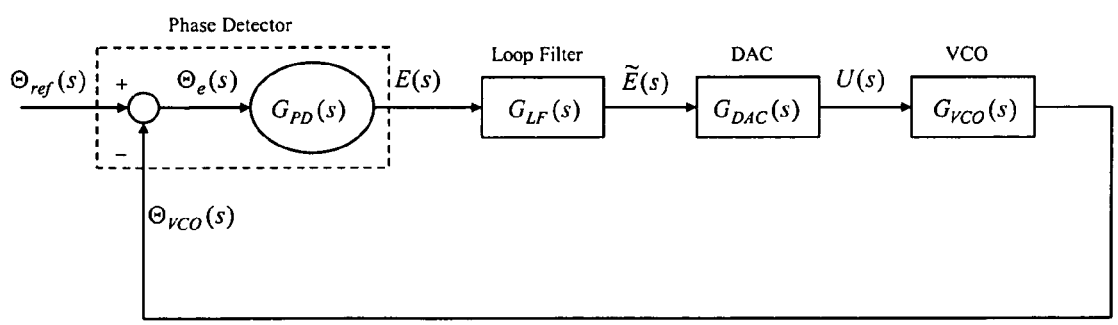
FIG. 11 is a functional block diagram illustrating a closed loop control model of the PLL of FIG. 6.

To model the PLL as a whole, denote $\Theta_{ref}(s)$ as the Laplace transform of $\theta_{ref}(t)$. The closed-loop control model of the PLL is shown in FIG. 11. The order of the loop is equal to the number of perfect integrators within the loop structure. Since the VCO is modeled as a perfect integrator, the loop is at least of order 1. If the loop filter also contains one perfect integrator, then the loop is of order 2.

Figure 12A:
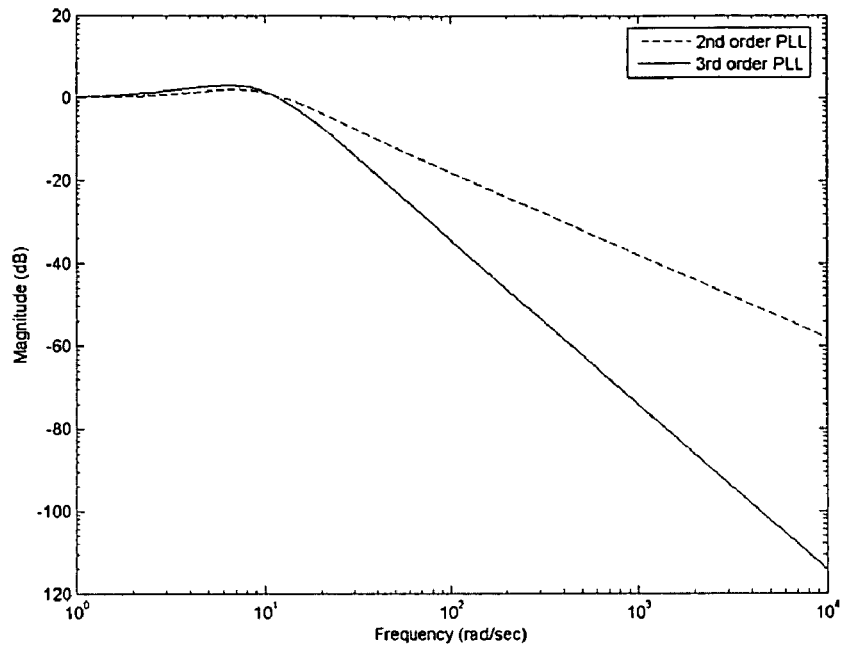
FIGS. 12*a* and 12*b* are magnitude and phase plots, respectively, of the frequency response of the $2^{nd}$ and $3^{rd}$ order PLLs that may be designed using the PLL design software according to an embodiment of the invention.
Figure 12B:
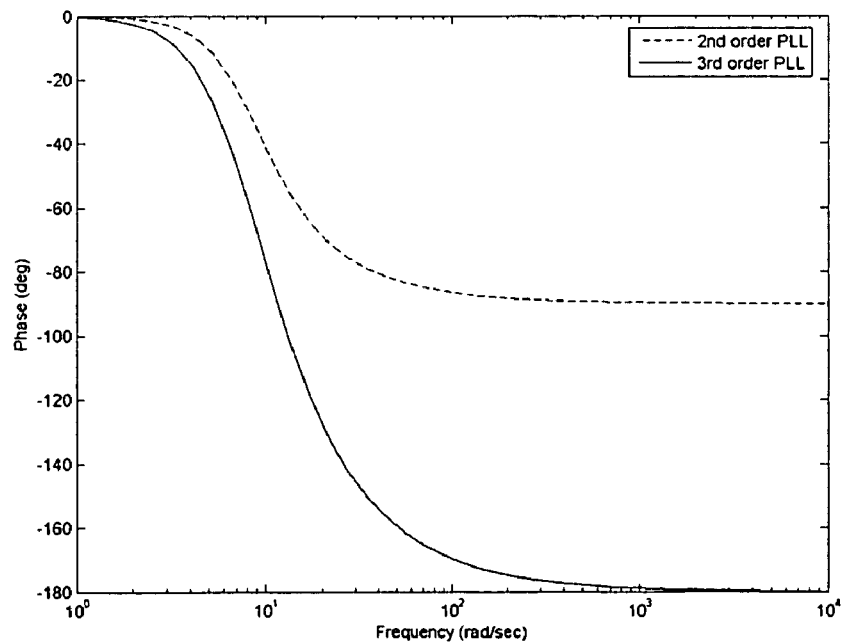

The order of the loop can be shown to greatly influence the steady-state performance of the loop. The performance of the third-order PLL is compared with the conventional second-order PLL (with a lag-lead filter) as shown in FIGS. 12a and 12b. As shown in FIGS. 12a-12b, an appropriately designed third-order PLL can exhibit much better performance than a second order A third order PLL may be more difficult to design than a second order PLL, however, where a trial and error approach is taken to PLL design.

Given the models described above for the DC, VCO, and DAC, the transfer function for the PLL may be written as:

$$G_{PLL}(s) = \frac{\Theta_{VCO}(s)}{\Theta_{ref}(s)} \quad (19)$$

$$= \frac{G_{PD}(s)G_{LF}(s)G_{DAC}(s)G_{VCO}(s)}{1+G_{PD}(s)G_{LF}(s)G_{DAC}(s)G_{VCO}(s)}$$

$$= \frac{K_{gain}G_{LF}(s)}{s+K_{gain}G_{LF}(s)}$$

where the forward gain $K_{gain}$ is given as $$K_{gain} = K_{PD}K_{DAC}K_{VCO} \quad (20)$$

$$= \frac{\Delta T \cdot \Delta V_{DAC} \cdot K_{VCO}}{2\pi \cdot DAC_{res}},$$

If the frequency axis of the VCO characteristics is expressed in Hertz instead of radians per second, this may be expressed as:

$$K_{gain} = \frac{\Delta T \cdot \Delta f_{VCO}}{DAC_{res}} \quad (21)$$

All the parameters from the above equations can easily be obtained from the supplier data sheets for the DAC and VCO. This enables the PLL software to compute the gain constant $K_{gain}$ of the PLL from available information once initial components have been selected. With the right choice of these components, the only unknown component which is the loop filter, $G_{LF}(s)$, can then be designed to obtain the desired system steady-state behavior. Accordingly, these equations may be used in a computer program to enable a second order PLL to be designed given a set of performance specifications, (e.g., system damping factor, etc.) and component characteristics.

In a similar manner, as described below, a computer program may also be used to design a third-order PLL (that is, a PLL with a second-order loop filter), which may be used to obtain improved performance over the traditional second-order PLL (a PLL with a first-order loop filter).

The basic goal of a control system is meeting the performance specifications for a given system. Performance specifications may be considered to be constraints put on the system response characteristics, and may be stated in any number of ways. Generally, performance specifications take two forms: 1) frequency-domain specifications (i.e., pertinent quantities expressed as functions of frequency), and 2) time-domain specifications (in terms of time response). The desired system characteristics may be prescribed in either or both of the above forms. In general, they specify three important properties of dynamic systems: 1) the speed of response, 2) the relative stability of the system, and 3) the system accuracy or allowable error.

A lag-lead filter (also known as a proportional-integral (PI) filter) has the following transfer function:

$$G_{LF}(s) = \frac{\tilde{E}(s)}{E(s)} = \frac{1+s\tau_2}{s\tau_1} = K_1 + \frac{K_2}{s}, \quad (22)$$

where $\tau_1$ and $\tau_2$ are time constants of the filter, $K_1 = \tau_2/\tau_1$, and $K_2 = 1/\tau_1$. The filter has a pole at $s=0$ and therefore behaves like an integrator. It has (at least theoretically) infinite gain at zero frequency. The closed-loop transfer function of the PLL if this type of filter is used is:

$$G_{PLL}(s) = \frac{\Theta_{VCO}(s)}{\Theta_{ref}(s)} = \frac{K_{PD}K_{VCO}G_{LF}(s)}{s+K_{PD}K_{VCO}G_{LF}(s)} \quad (23)$$

$$G_{PLL}(s) = \frac{\frac{K_{gain}}{\tau_1}(\tau_2 s + 1)}{s^2 + \frac{\tau_2 K_{gain}}{\tau_1}s + \frac{K_{gain}}{\tau_1}} \quad (24)$$

which is of the form:

$$G_{PLL}(s) = \frac{2\zeta\omega_n s + \omega_n^2}{s^2 + 2\zeta\omega_n s + \omega_n^2}, \quad (25)$$

where $\omega_n$ and $\zeta$ are the natural frequency and damping factors, respectively, and are specified in terms of $K_{gain}$, $\tau_1$ and $\tau_2$ as:

$$\omega_n = \sqrt{\frac{K_{gain}}{\tau_1}}, \quad (26)$$

$$\zeta = \frac{\omega_n \tau_2}{2}. \quad (27)$$

These two parameters are usually used to specify the performance requirements of a system. The poles of the closed loop system are $$s_{0,1} = -\zeta\omega_n \pm j\omega_n\sqrt{1-\zeta^2}. \quad (28)$$

The damping factor has an important influence on the dynamics of a PLL. When $\zeta>1$, the poles are real; and when $\zeta<1$, the poles are complex and conjugate. When $\zeta=1$, the poles are repeated and real and the condition is called critical damping. When $\zeta<1$, the response is underdamped and the poles are complex.

The transient response of the closed-loop system is increasingly oscillatory as the poles approach the imaginary axis when $\zeta$ approaches zero. The above model can be directly applied to the PLL in the continuous-time domain.

Another important piece of information to know about a given PLL is the steady-state error, that is, the error remaining after all the transients have died out. The equation for the error transfer function is:

$$G_e(s) = \frac{\Theta_e(s)}{\Theta_{ref}(s)} \quad (29)$$

$$= \frac{\Theta_{ref}(s) - \Theta_{VCO}(s)}{\Theta_{ref}(s)}$$

$$= \frac{s}{s+K_{PD}K_{VCO}G_{LF}(s)}$$

$$= 1 - G_{PLL}(s),$$

$$G_e(s) = \frac{s^2}{s^2 + \frac{\tau_2 K_{gain}}{\tau_1}s + \frac{K_{gain}}{\tau_1}}. \quad (30)$$

To understand how a PLL will respond, the performance of the PLL to different disturbances occurring at t=0 may be examined. Knowing the error transfer function $G_e(z)$ of the PLL, it is possible to determine the response on the important excitation signals such as phase step, frequency step and frequency ramp at the input. The idea here is to analyze the steady-state errors after any transients have died away. These steady-state error is readily evaluated by means of the final value theorem, which states that:

$$\lim_{t \to \infty} \theta_e(t) = \lim_{s \to 0} s\Theta_e(s) = \lim_{s \to 0} sG_e(s)\Theta_{ref}(s). \quad (31)$$

To determine how a PLL will respond to a phase step applied at the PLL input, it is possible to look at the steady-state error resulting from a step change of input phase of magnitude $\Delta\theta$. At t=0, the following step function is applied:

$$\theta_{ref}(t) = \Delta\theta \cdot u(t) \quad (32)$$

where u(t) is the unit step function. In the s-domain, this can be expressed as:

$$\Theta_{ref}(s) = \frac{\Delta\theta}{s}. \quad (33)$$

Application of the final value theorem to the phase error function yields:

$$\lim_{t \to \infty} \theta_e(t) = \lim_{s \to 0} sG_e(s)\frac{\Delta\theta}{s} = 0. \quad (34)$$

The above shows there is no steady-state error resulting from a step change of phase. This shows that the loop will eventually track any change of input phase.

Although the PLL will track a phase step, that is not the only type of change that may be applied to the PLL. For example, it is also necessary to determine the behavior of the PLL if a phase ramp (i.e., frequency step) is applied at the PLL input, for example a frequency step of magnitude $\Delta\omega$ applied at the input. Because the phase $\theta_{ref}(t)$ is the integral over the frequency:

$$\theta_{ref}(t) = \Delta\omega \cdot t, \quad (35)$$

which shows that the input phase is a ramp with slope $\Delta\omega$. In the s-domain this may be expressed as:

$$\Theta_{ref}(s) = \frac{\Delta\omega}{s^2}. \quad (36)$$

Applying the final value theorem results in the following equation:

$$\lim_{t \to \infty} \theta_e(t) = \lim_{s \to 0} sG_e(s)\frac{\Delta\omega}{s^2} = 0. \quad (37)$$

which shows that the phase error tends to zero as $t \to \infty$.

Another type of perturbation that may occur is a frequency ramp applied at the PLL input. To determine how this affects the PLL performance, assume that the frequency ramp has a magnitude of $\Delta\dot{\omega}$ applied at the input. Because the phase $\theta_{ref}(t)$ is the integral over the frequency it may be shown that:

$$\theta_{ref}(t) = \Delta\dot{\omega} \cdot \frac{t^2}{2}, \quad (38)$$

where the input frequency is a ramp with slope $\Delta\dot{\omega}$. In the s-domain this may be expressed as:

$$\Theta_{ref}(s) = \frac{\Delta\dot{\omega}}{s^3}. \quad (39)$$

Applying the final value theorem, it may be shown that:

$$\lim_{t \to \infty} \theta_e(t) = \lim_{s \to 0} sG_e(s)\frac{\Delta\dot{\omega}}{s^3} = \frac{\tau_1 \Delta\dot{\omega}}{K_{gain}} = \frac{\Delta\dot{\omega}}{\omega_n^2}. \quad (40)$$

For $\Delta\dot{\omega}=1$, $$\lim_{t \to \infty} \theta_e(t) = \tau_1 / K_{gain}.$$

This show that the phase error tends to zero as $t \to 0$ only for high-gain loop. For a low-gain loop, the PLL would exhibit a non-zero steady-state phase error in the presence of a frequency ramp.

These equations may be used, for example in a computer program product, to design a loop filter for a PLL. A number of parameters of the design have to be specified before applying the following design steps. These parameters include, the center frequency of the VCO $\omega_o$, and damping factor $\zeta$. Conventional programming techniques may be used to implement the computer program given the equations set forth above, and the invention is not limited to a particular implementation using a particular computer language or operating system.

Apart from the VCO, all the other components in the PLL are digital. The PLL may therefore be considered a digital PLL. In the PLL, the sampling of the phase error e(t) (and the computation of the filtered error $\tilde{e}(t)$) occurs every $\Delta T$ bits assuming a delay variation free system. The period of $\Delta T$ bits is equivalent to a sampling period of $\Delta t = \Delta T/f_o$, where $f_o$ is the nominal system frequency in bits per second. Through simulations and laboratory experiments, it has been observed that $\Delta T$ should be selected to be very high (e.g., $\Delta T \geq 308800$ bits for T1 rate) in order to minimize the loop tracking error (due to thermal noise, input phase dynamics, and in particular, network delay variation).

To design a digital PLL, it is possible to use a known approach commonly referred to as design by emulation. The design by emulation approach involves designing a continuous time loop filter, digitizing the continuous time loop filter, and then using discrete analysis, simulations, or experimentation to verify the design. Design by emulation yields good results only when the sampling rates $\omega_{samp}=2\pi/\Delta t$ are at least $20\omega_n$, that is $\omega_n \Delta t \leq 2\pi/20$. In the following example, the following value has been selected $\omega_n \Delta t = 2\pi/35$.

To design a second order loop, the first step is to collect the design pre-specifications. Specifically, the center frequency of the VCO $\omega_o = 2\pi f_o$ will be specified at this stage of the design process. This parameter is usually obtained from the VCO data sheet that is provided by the VCO supplier. Additionally, the damping factor $\zeta$ should be specified. These values may be input (200) to the PLL design computer program for use by the program in connection with designing the PLL.

The gain of the DAC will then need to be computed. If the DAC register is specified as L bits long, giving the DAC a resolution of $DAC_{res} = 2^L$, then the gain $K_{gain}$ may be computed using the following equation $$K_{gain} = \frac{\Delta T \cdot \Delta V_{DAC} \cdot K_{VCO}}{2\pi \cdot 2^L}.$$

To enable the PLL design software to compute the gain, the length L of the DAC should be input to the PLL design software.

Once the gain is determined, the natural frequency $\omega_n$ of the PLL will be determined by the PLL design software using the following equation:

$$\omega_n = \frac{2\pi}{35 \Delta t} \quad (41)$$

The PLL design software will then determine the parameters $\tau_1$ and $\tau_2$ of the loop filter from the following two equations:

$$\tau_1 = \frac{K_{gain}}{\omega_n^2} \quad (42)$$

$$\tau_2 = \frac{2\zeta}{\omega_n} \quad (43)$$

Knowing the natural frequency, it is possible to also determine the lock-in time $T_L$ (also called the setting time) as $$T_L \approx \frac{2\pi}{\omega_n}. \quad (44)$$

Once these parameters have been calculated, the PLL design software will proceed to determine the stability characteristics of the PLL. Knowing whether a system is absolutely stable or not is generally insufficient information for most control applications. Specifically, even if a system is stable, it is often desirable to know how close it is to being unstable. To do this, the PLL design software will need to be able to calculate the relative stability of the system. In addition to explaining how the relative stability may be determined, the following discussion will also help explain how the PLL design software may be used to design a third-order PLL.

The open-loop transfer function of the PLL will be denoted as: $K_{OL}G_{OL}(s) = G_{PD}(s)G_{LF}(s)G_{DAC}(s)G_{VCO}(s)$. From this, it is possible to define the following two important measures that are used to indicate the stability margin in a system:

The gain margin (GM), which is a measure of relative stability, is defined as the magnitude of the reciprocal of the open-loop transfer function, evaluated at the frequency $\omega_c$ at which the phase angle is $-180°$. This is, $$GM \equiv \frac{1}{|K_{OL}G_{OL}(j\omega_c)|}, \quad (45)$$

where $\arg K_{OL}G_{OL}(j\omega_c) = -180° = -\pi$ radians and $\omega_c$ is called the phase crossover frequency. The gain margin of the system is the factor by which the gain $K_{OL}$ can be raised before instability results. $|GM| < 1$ (or $|GM| < 0$ dB) indicates an unstable system.

The phase margin (PM), $\phi$, which is a measure of relative stability, is defined as 180° plus the phase angle $\phi_1$ of the open-loop transfer function at unity gain. That is, $$\phi \equiv [180 + \arg K_{OL}G_{OL}(j\omega_1)] \text{ degrees}, \quad (46)$$

where $|K_{OL}G_{OL}(j\omega_1)| = 1$ and $\omega_1$ is called the gain crossover frequency. The phase margin is the amount by which the phase of $G_{OL}(j\omega)$ exceeds $-180°$ when $|K_{OL}G_{OL}(j\omega)| = 1$. A positive phase margin is required for stability.

In a typical case, the gain margin can be read directly from the Bode plot by measuring the vertical distance between the $|K_{OL}G_{OL}(j\omega)|$ curve and the $|K_{OL}G_{OL}(j\omega)| = 1$ line at the frequency where $\angle K_{OL}G_{OL}(j\omega) = 180°$. The gain margin can also be determined from the root locus with respect to $K_{OL}$ by noting two values of $K_{OL}$: at the point where the locus crosses the j$\omega$-axis, and at the nominal closed-loop poles. The GM is the ratio of these two values.

Both unity gain and 180° excess phase shift (i.e., more negative than the $-180°$ that is built in with negative feedback) are necessary for oscillations so the margins relative to this pair of conditions become a measure of stability. Gain margin is the additional gain necessary to give unity open-loop gain when the open-loop excess phase is 180°. Phase margin is the additional open-loop phase shift necessary to give 180° excess phase when the open-loop gain is unity. All PLLs have $-90°$ phase shift due to the 1/s term, so excess phase is 90° even before any effect from the loop filter is considered. Whether a loop will oscillate when its gain exceeds unity at 180° is more easily seen from the Nyquist plot or from the root locus plot than from the Bode plot. However, in most cases it will not operate properly under these conditions, and the Bode plot is adequate.

As set forth above, the PLL design software may use this process to design a second-order PLL. However, as shown in FIGS. 12a and 12b, the characteristics of a third-order PLL may be more advantageous than those of a second-order PLL. Accordingly, in certain circumstances it may be advantageous to design a third-order PLL.

Although mathematically more tedious to analyze, it has been shown that the type 2 third-order loop has better noise suppression and faster lockup time. As used herein, the order of the loop is defined as being equal to the number of poles in the open-loop transfer function. This is also the highest power of s in the denominator. The loop type is the number of such poles that are at the origin, s=0.

Compared to second-order loop PLL design, there are very few publications on third-order loops. This is partly because of the far-greater popularity of the second-order loop, and also because of the greater complexity involved in analyzing the third-order loops. The transfer function of the filter in a loop may be given as:

$$G_{LF}(s) = \frac{1}{1+s\tau_3} \frac{1+s\tau_2}{s\tau_1}. \quad (47)$$

With this filter, the loop has two perfect integrators, one being the VCO and one being the phase integrator part of the filter, and three time constants.

The closed-loop transfer function of the third-order loop may be expressed as:

$$G_{PLL}(s) = \frac{K_{gain}G_{LF}(s)}{s + K_{gain}G_{LF}(s)} \quad (48)$$

$$= \frac{K_{gain}(\tau_2 s + 1)}{\tau_1\tau_3 s^3 + \tau_1 s^2 + K_{gain}\tau_2 s + K_{gain}}$$

$$= \frac{\frac{K_{gain}}{\tau_1\tau_3}(\tau_2 s + 1)}{s^3 + \frac{1}{\tau_3}s^2 + \frac{K_{gain}\tau_2}{\tau_1\tau_3}s + \frac{K_{gain}}{\tau_1\tau_3}}$$

Applying the final value theorem, it is possible to determine the steady-state response of the loop to different input signals $1/s^n$, phase step (n=1), frequency step (n=2), frequency ramp (n=3), etc. The error transfer function for the third-order loop is given as:

$$G_e(s) = 1 - G_{PLL}(s) = \frac{s^3 + \frac{1}{\tau_3}s^2}{s^3 + \frac{1}{\tau_3}s^2 + \frac{K_{gain}\tau_2}{\tau_1\tau_3}s + \frac{K_{gain}}{\tau_1\tau_3}} \quad (49)$$

So, by applying the final value theorem, when the loop is driven by $1/s^n$, the error response approaches a final value of:

$$\lim_{t\to\infty}\theta_e(t) = \lim_{s\to 0}sG_e(s)\frac{1}{s^n} = \lim_{s\to 0}\frac{\tau_1}{K_{gain}}s^{3-n}. \quad (50)$$

This indicates that the phase error resulting from a phase step (n=1) or a frequency step (n=2) will settle to zero, and the phase error will not reach steady state for n>3. A frequency ramp (n=3)) will produce a steady-state phase error of $$\lim_{t\to\infty}\theta_e(t) = \tau_1/K_{gain},$$

the same phase error that occurs in the second-order loop. This is not surprising since one way to realize the third-order loop is to add a low-pass filter to the lag-lead filter (of the second-order loop above). The output of a low-pass filter driven by a ramp is another ramp with the same slope, offset from the input by a constant.

Given a set of pre-specified design parameters $\phi$ (the phase margin) and $\omega_n$ (the natural loop frequency), it is possible to obtain the design the parameters $\tau_1$, $\tau_2$, and $\tau_3$ of the third-order loop. Derivation of these parameters is known in the art, for example as taught by U. L. Rohde, *Digital PLL Frequency Synthesizers: Theory and Design*, Prentice-Hall, Englewood Cliffs, N.J., 1983, the content of which is hereby incorporated by reference. To get acceptable stability of the loop, a phase margin of at least 30° is generally required, although a typical design choice is 45°.

To design a third order loop, the PLL design software will first enable the user to input the design pre-specifications. Specifically, the user will be allowed to input the phase margin $\phi$ for the loop. As mentioned above, a typical value for the phase margin is $\phi=45°$. The PLL software will also allow the user to specify the natural loop frequency, which may assume a value similar to that described above with respect to the second-order loop, $\omega_n=2\pi/35\Delta t$. By selecting this parameter to be the same as the second order loop described above, the bandwidth of the third-order loop may be expected to be close to that of the second-order loop.

Given these parameters, the PLL design software will compute the following parameters $\tau_1$, $\tau_2$, and $\tau_3$ as follows:

Compute the time constant $\tau_3$ as follows:

$$\tau_3 = \frac{-\tan\phi + 1/\cos\phi}{\omega_n}. \quad (51)$$

Then compute the time constant $\tau_2$ using:

$$\tau_2 = \frac{1}{\omega_n^2 \tau_3}. \quad (52)$$

Next, compute the last time constant $\tau_1$ from:

$$\tau_1 = \frac{K_{gain}}{\omega_n^2}\sqrt{\frac{1+\omega_n^2\tau_2^2}{1+\omega_n^2\tau_3^2}}, \quad (53)$$

$$K_{gain} = \frac{\Delta T \cdot \Delta f_{VCO}}{DAC_{res}}.$$

FIG. 12 shows the frequency response of second- and third-order PLLs that may be designed using this process. These plots are obtained from equations (24) and (48), respectively, for the second-order and third-order loops. From these figures it can be seen that the delay variation suppression characteristics of the third-order PLL are much better than that of the second-order PLL. The parameters used in the plots are: $\zeta=0.707$, $DAC_{res}=2^{12}=4096$, $f_o=1.544\times10^6$ MHz, $\Delta ppm=0.0002$, $\Delta V_{DAC}=1.5$ Volts, $\Delta f_{VCO}=308.8$ Hz, $\Delta T=30880$ bits ($\Delta t=0.02$ s), $K_{gain}=2328.06$, $\omega_n=8.97598$ rad/s, second-order loop ($\tau_1=28.8956$ s, $\tau_2=0.157532$ s), third-order loop ($\phi=45°$, $\tau_1=69.76$ s, $\tau_2=0.268964$ ms, $\tau_3=0.0461469$ ms). The invention is not limited to this particular example, which was rather provided to illustrates the performance differences between second and third order loops.

In the proceeding description, a software program that may implement a procedure for designing the loop filters for the second- and third-order loops has been described in the continuous-time domain. Once the PLL is designed using the PLL design software, the phase detector and loop filter have to be implemented in digital form on a processor or in hardware form since the PLL using timestamps is a digital PLL. To do this, the continuous-time representations of the loop filters may be digitized. To do this design by emulation principles may be used whereby a continuous time filter is first designed and then digitized to obtain a discrete time filter. The digitization procedure in this instance may be done using the Tustin's or bilinear approximation of the continuous-time functions.

For example, knowing the two parameters of the loop filter of the second order PLL, $G_{LF}(s)$, it would be desirable to find a set of difference equations (or $G_{LF}(z)$ for the digital implementation of the filter). Using the Tustin's or bilinear approximation for the digitization of $G_{LF}(s)$, it is possible, for every occurrence of s in the loop filter, to substitute:

$$s = \frac{2}{\Delta t}\left(\frac{1-z^{-1}}{1+z^{-1}}\right), \quad (54)$$

where $\Delta t$ is the sampling interval for the system. Accordingly:

$$G_{LF}(z) = G_{LF}(s)\bigg|_{s=\frac{2}{\Delta t}\left(\frac{1-z^{-1}}{1+z^{-1}}\right)} = \frac{\tilde{E}(z)}{E(z)} = \frac{1 + \frac{2\tau_2}{\Delta t}\left(\frac{1-z^{-1}}{1+z^{-1}}\right)}{\frac{2\tau_1}{\Delta t}\left(\frac{1-z^{-1}}{1+z^{-1}}\right)}, \quad (55)$$

which gives the following difference equation for implementing the loop filter for the second-order loop:

$$\tilde{e}(n) = \tilde{e}(n-1) + \frac{\Delta t + 2\tau_2}{2\tau_1}e(n) + \frac{\Delta t - 2\tau_2}{2\tau_1}e(n-1). \quad (56)$$

With this equation, the phase detector and the loop filter can be implemented in the digital domain with a sampling interval $\Delta t$. Thus, once a PLL has been designed using the PLL design software, the PLL may be implemented in digital circuitry in a straightforward manner using known techniques.

Similarly, knowing the three parameters of the loop filter of the third-order PLL, $G_{LF}(z)$ may be obtained as follows:

$$G_{LF}(z) = G_{LF}(s)\bigg|_{s=\frac{2}{\Delta t}\left(\frac{1-z^{-1}}{1+z^{-1}}\right)} \quad (57)$$

$$= \frac{\tilde{E}(z)}{E(z)}$$

$$= \frac{1 + \frac{2\tau_2}{\Delta t}\left(\frac{1-z^{-1}}{1+z^{-1}}\right)}{\frac{2\tau_1}{\Delta t}\left(\frac{1-z^{-1}}{1+z^{-1}}\right)\left[1 + \frac{2\tau_3}{\Delta t}\left(\frac{1-z^{-1}}{1+z^{-1}}\right)\right]}.$$

This gives the following difference equation for implementing the loop filter for the third-order loop:

$$\tilde{e}(n) = \frac{4\tau_3}{\Delta t + 2\tau_3}\tilde{e}(n-1) + \frac{(\Delta t - 2\tau_3)}{\Delta t + 2\tau_3}\tilde{e}(n-2) + \frac{\Delta t(\Delta t + 2\tau_2)}{2\tau_1(\Delta t + 2\tau_3)}e(n) + \quad (58)$$

$$\frac{2(\Delta t)^2}{2\tau_1(\Delta t + 2\tau_3)}e(n-1) + \frac{\Delta t(\Delta t - 2\tau_2)}{2\tau_1(\Delta t + 2\tau_3)}e(n-2)$$

These filter equations can be implemented in digital form in a processor or as a hardware computational component of the PLL. Accordingly, once a third-order PLL has been designed using the PLL design software, the PLL may be implemented in hardware in a straightforward manner.

To determine the filtered Error-to-DAC/VCO mapping function, the frequency resolution $f_{res}$ of the VCO will be defined to be:

$$f_{res} = \frac{f_o \cdot \Delta ppm}{DAC_{res}}. \quad (59)$$

As shown below, a combined DAC-VCO model may be developed which can then be used to develop the error mapping function for the PLL. Specifically, assume that the DAC register is specified to be L bits long, giving the resolution of the $DAC_{res}=2^L$. The error mapping function maps a filtered error value $\tilde{e}$, which is a floating point number, to a corresponding DAC input value, which is a integer in the range $[0, 2^L-1]$.

To develop a combined DAC-VCO model, the DAC input $DAC_{VCO}$ ($DAC_{VCO} \in [0, DAC_{res}-1]$) will be defined as:

$$DAC_{VCO}(t) = DAC_o + \tilde{e}(t) = DAC_o + DAC_{corr}(t) \quad (60)$$

where $DAC_{corr}(t)=\tilde{e}(t)$ is the filtered error and $DAC_o$ is the nominal DAC value (corresponding to the nominal frequency $f_o$). The VCO output frequency can then be expressed as:

$$f_{VCO}(n) = f_{res} DAC_{VCO}(t) \quad (61)$$

$$= f_{res}[DAC_o + DAC_{corr}(t)]$$

$$= f_o + f_{res} DAC_{corr}(t)$$

The above expression corresponds to an angular frequency:

$$\omega_{VCO}(t) = \omega_o + 2\pi f_{res} DAC_{corr}(t) = \omega_o + K_{DAC\text{-}VCO} DAC_{corr}(t) = \omega_o + \Delta\omega(t), \quad (62)$$

where $$K_{DAC\text{-}VCO} = \frac{2\pi \cdot f_o \cdot \Delta ppm}{DAC_{res}} \quad (63)$$

is the combined DAC-VCO gain. By definition, the phase of the VCO $\theta_{VCO}$ is given by the integral over the frequency variation $\Delta\omega(t) = \omega_{VCO}(t) - \omega_{norm}$ as:

$$\theta_{VCO}(t) = \int_0^t \Delta\omega(x)dx = K_{DAC\text{-}VCO}\int_0^t DAC_{corr}(x)dx, \quad (64)$$

which is consistent with the DAC and VCO models developed above.

To develop the error mapping function, it will be assumed that the time generation period is constant, i.e., $\Delta T$. In the PLL being developed, the input frequencies $f_s$ and $\hat{f}_s$ are essentially divided down to lower frequencies which will be denoted as $f_{\Delta T}$ and $f_{\Delta R}$, respectively. In steady-state (or the tracking phase) of the PLL, $f_s \approx \hat{f}_s$ (or similarly $f_{\Delta T} \approx f_{\Delta R}$). Additionally, assuming a given timestamp generation period of $\Delta T$ (which is equal to $\Delta R$ in a system without delay variations), there is the following frequency relationship for a system without delay variations: $\hat{f}_s = \Delta T \cdot f_{\Delta T}$.

Accordingly, this shows that measurement and control are carried out at the clock frequency $f_{\Delta T} \approx f_{\Delta R}$ which is essentially the sampling frequency for the receiver PLL. The errors e(n) from the phase detector are generated at this frequency $f_{\Delta T} \approx f_{\Delta R}$, but, the receiver oscillator operates at the service frequency $f_s \approx \hat{f}_s$. Also, the loop parameters derived above are based on the sampling frequency $f_{\Delta T} \approx f_{\Delta R}$. Thus, the error values generated at the lower frequency $f_{\Delta T} \approx f_{\Delta R}$ have to be scaled to appropriate values so that they can applied to the receiver oscillator which operates at the service frequency $f_s \approx \hat{f}_s$.

To enable the errors to be mapped, new mapping functions must be created to map the filtered error values generated by the loop filter (which operates at the lower nominal frequency $f_{\Delta T} = f_o/\Delta T$) into appropriate values for the controlling the oscillator (which operates at the higher nominal frequency $f_o$).

With a slight change of notation, $DAC_{VCO}(f_{\Delta T}, t)$ will be used to denote the VCO control input at time t computed based on system parameters at the scaled-down frequency $f_{\Delta T} \approx f_{\Delta R}$. Also, $DAC_{VCO}(f_o, t)$ will be used to denote the VCO control input at time t computed based on system parameters at the nominal frequency $f_o$. Accordingly:

$$\hat{f}_s(t) = f_o + f_{res} DAC_{VCO}(f_o, t) \qquad (65)$$
$$= \Delta T \cdot f_o(f_{\Delta T}(t)) + f_{res} DAC_{VCO}(f_o, t)$$

from which the following equations may be derived:

$$f_{\Delta R}(t) = f_{\Delta T}(t) \qquad (66)$$
$$= \frac{\hat{f}_s(t)}{\Delta T}$$
$$= f_o(f_{\Delta T}) + f_{res} \frac{DAC_{VCO}(f_o, t)}{\Delta T}$$

And, accordingly:

$$DAC_{VCO}(f_{\Delta T}, t) = \frac{DAC_{VCO}(f_o, t)}{\Delta T} \qquad (67)$$

or:

$$DAC_{VCO}(f_o, t) = \Delta T \cdot DAC_{VCO}(f_{\Delta T}, t) \qquad (68)$$
$$= DAC_o(f_o) + \tilde{e}(f_o, t),$$

where $DAC_o(f_o)$ is the nominal DAC value corresponding to the nominal frequency $f_o$, and $\tilde{e}(f_o, t)$ is the filtered error at time t computed based system frequency $f_o$.

As discussed above:

$$DAC_{VCO}(f_{\Delta T}, t) = DAC_o(f_{\Delta T}) + \tilde{e}(f_{\Delta T}, t), \qquad (69)$$

and the DAC/VCO operations have been defined around the nominal DAC value $DAC_o(f_o)$ and frequency $f_o$ as $$DAC_{VCO}(f_o, t) = \Delta T \cdot DAC_{VCO}(f_{\Delta T}) \qquad (70)$$
$$= DAC_o(f_o) + DAC_{corr}(f_o, t)$$

where $DAC_{corr}(f_o, t)$ is the DAC correction factor corresponding to the nominal frequency $f_o$, at time t. But it is also possible to define the DAC/VCO operations around the DAC value $DAC_o(f_{\Delta T})$ and frequency $f_{\Delta T}$ as:

$$DAC_{VCO}(f_{\Delta T}, t) = \frac{DAC_{VCO}(f_o, t)}{\Delta T} \qquad (71)$$
$$= DAC_o(f_{\Delta T}) + DAC_{corr}(f_{\Delta T}, t)$$

where $DAC_{corr}(f_{\Delta T}, t)$ is the DAC correction factor corresponding to the scaled down nominal frequency $f_{\Delta T}$, at time t.

From the above equation it may be shown that:

$$DAC_{VCO}(f_o, t) = \Delta T \cdot DAC_{VCO}(f_{\Delta T}, t) \qquad (72)$$
$$= \Delta T \cdot DAC_o(f_{\Delta T}) + \Delta T \cdot DAC_{corr}(f_{\Delta T}, t)$$

Comparing (70) and (72), we get $$DAC_o(f_o) = \Delta T \cdot DAC_o(f_{\Delta T}), \text{ and} \qquad (73)$$
$$DAC_{corr}(f_o, t) = \Delta T \cdot DAC_{corr}(f_{\Delta T}, t) \qquad (74)$$
$$= \Delta T \cdot \tilde{e}(f_{\Delta T}, t)$$

Figure 13:
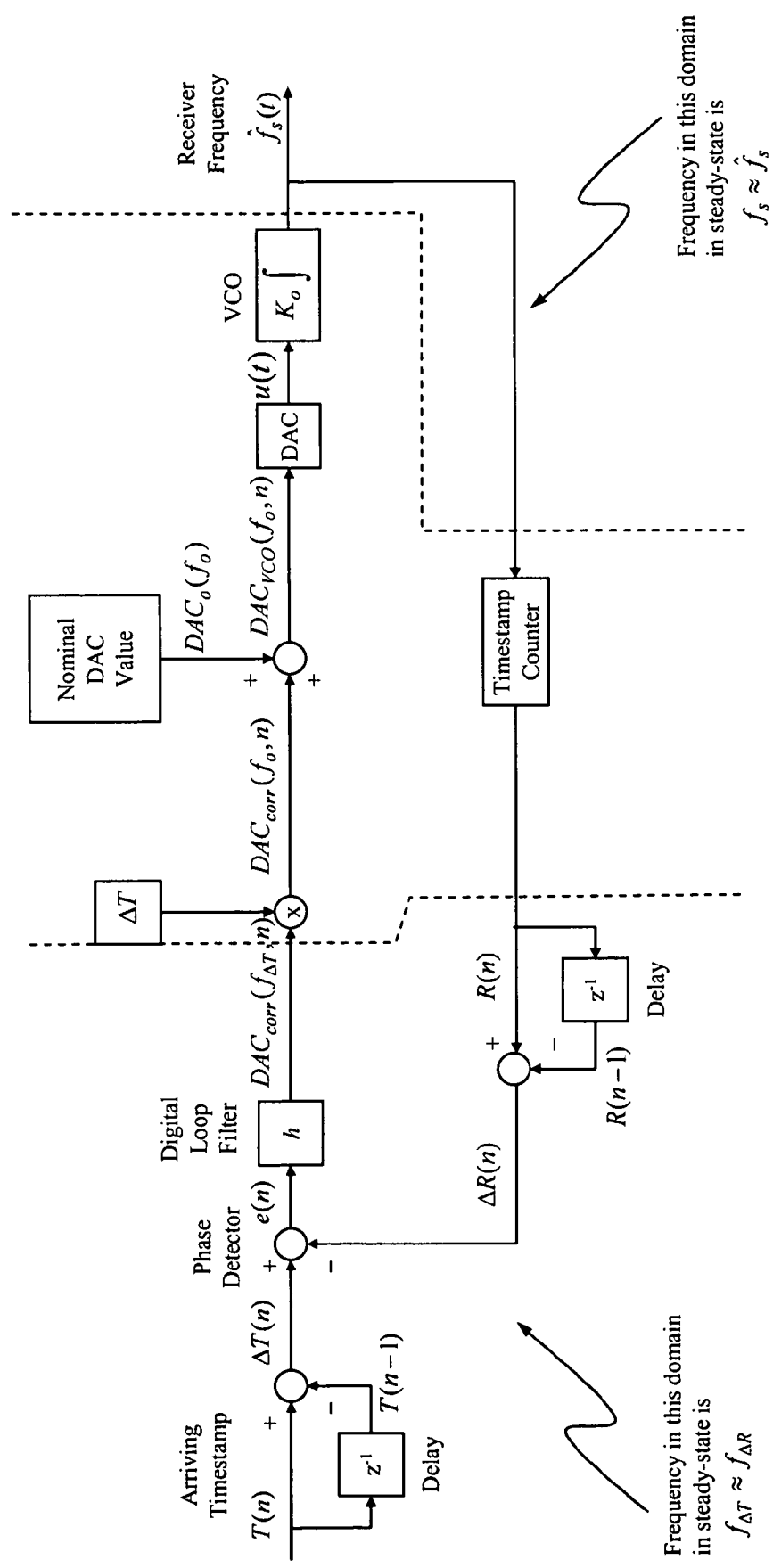
FIG. 13 is a functional block diagram of a PLL with error-DAC/VCO mapping functions shown in the discrete time domain.

The above equation shows that, although, a filtered error $\tilde{e}(f_{\Delta T}, t)$ is obtained based on the filter gains computed from the system parameters and the scaled down nominal frequency $f_{\Delta T} = f_s/\Delta T$, a corresponding error $\tilde{e}(f_o, t)$ (which is based on the VCO nominal output $f_{norm}$ as shown in FIG. 13) can readily be obtained by multiplying by the mapping factor $\Delta T$. This equation allows for two frequency domains to be used in the PLL design and at the same time obtain correct control inputs for proper system operation.

Since the DAC takes integer values in the range $DAC_{VCO}(f_o, t) \in [0, 2^L - 1]$, the error $\tilde{e}(f_o, t) = \Delta T \cdot \tilde{e}(f_{\Delta T}, t)$ must be rounded off to the nearest integer before being added to $DAC_o(f_o)$, that is, the error mapping function may be obtained as $$DAC_{VCO}(f_o, t) = DAC_o(f_o) + Int[\Delta T \cdot \tilde{e}(f_{\Delta T}, t)]. \qquad (75)$$

The above error mapping function is straightforward and very simple to implement as illustrated in FIG. 13.

The DAC has a nominal value that affects the operating frequency of the oscillator. Ideally, the nominal DAC setting would produce a voltage that always caused the oscillator to produce the desired nominal frequency. During tracking of the reference frequency, any error encountered produces a DAC offset that, when added to the nominal DAC setting, minimizes the error (negative feedback control). In practice, the nominal DAC setting has to be determined and may have to be readjusted during operation to account for temperature changes and aging effects. In other situations, it may not be possible to accurately determine the exact nominal DAC value. Therefore, it would be desirable to have a technique that can adaptively determine the optimal nominal DAC setting to eliminate the need to have an accurate initial DAC setting before use and/or to eliminate the need to manually readjust the nominal DAC setting during operation. Another advantage of adaptively determining the optimal nominal DAC setting is that it enables the DAC offset computed during operation to be as small as possible. When the DAC offset needed to minimize the error is obtained, the error begins to get smaller and in turn, reduces the DAC offset, causing the error to grow again. When a large DAC offset is needed, the cycle will be long and the correction will be less accurate than when the DAC offset is small.

Figure 14A:
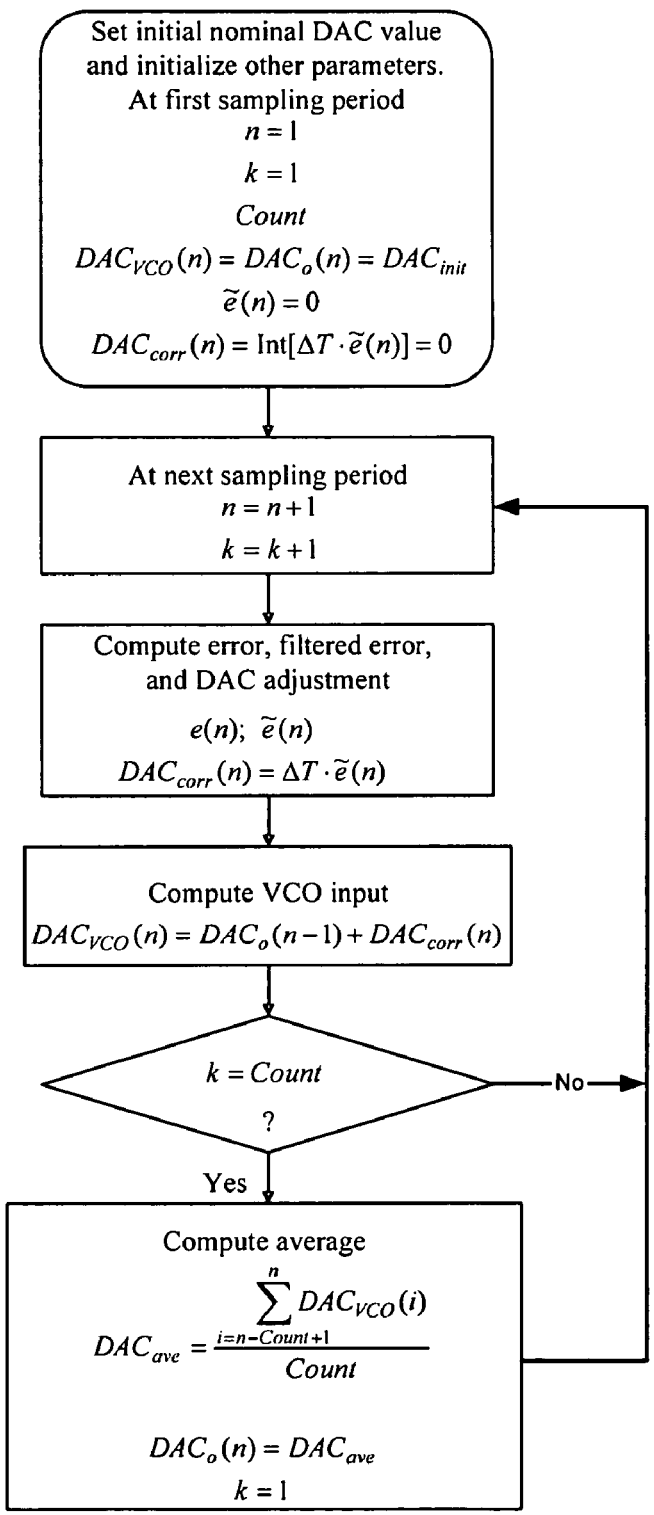
FIGS. 14*a* and 14*b* are flow charts of a dynamic mapping function process using, respectively, samples in non-overlapping windows and samples in overlapping windows.
Figure 14B:
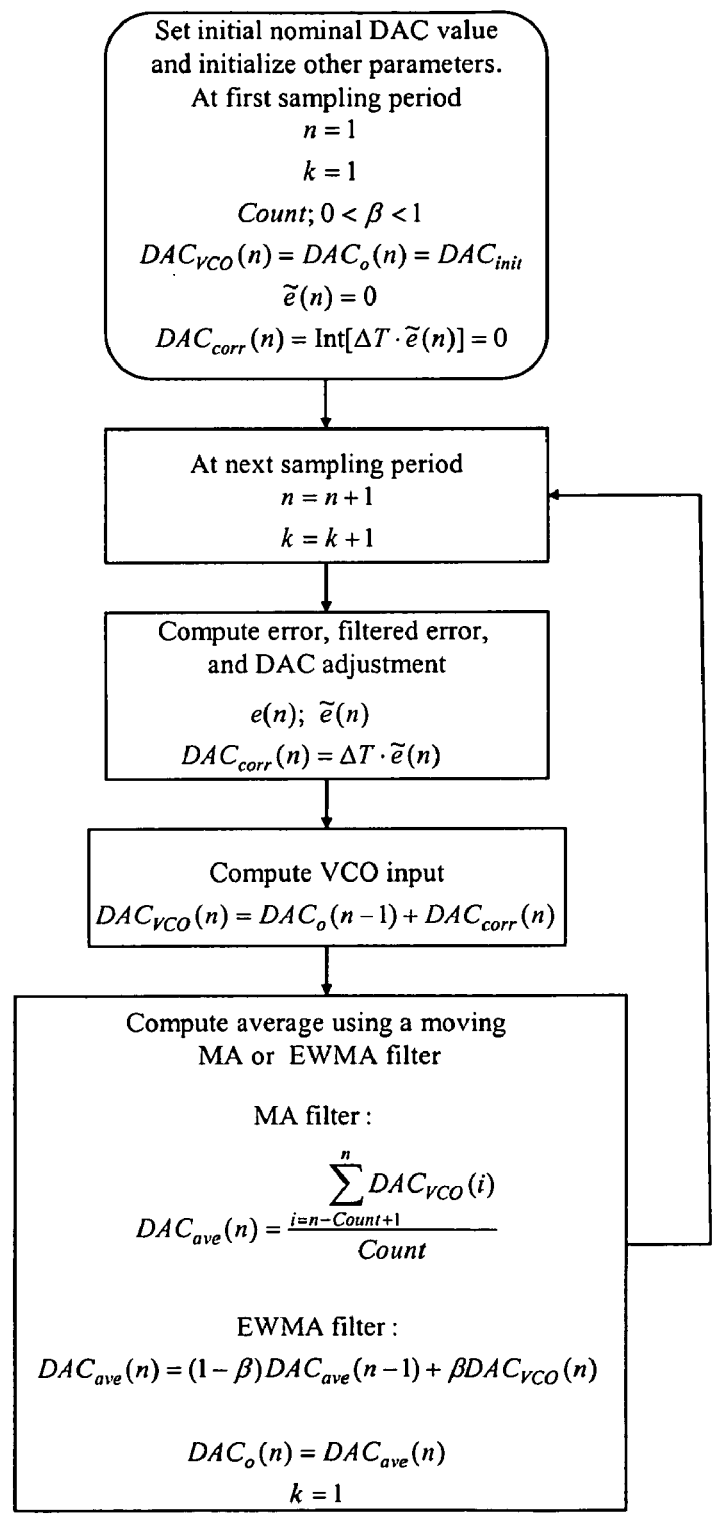

Although a number of variations and optimizations are possible, the basic techniques to adaptively re-compute the optimal nominal DAC setting are shown in FIGS. 14a and 14b. Specifically, FIG. 14a shows a dynamic mapping function using samples in non-overlapping windows, and FIG. 14b shows the dynamic mapping function using samples in overlapping windows. Since these figures are self-explanatory, additional description of these figures has been omitted.

Figure 16:
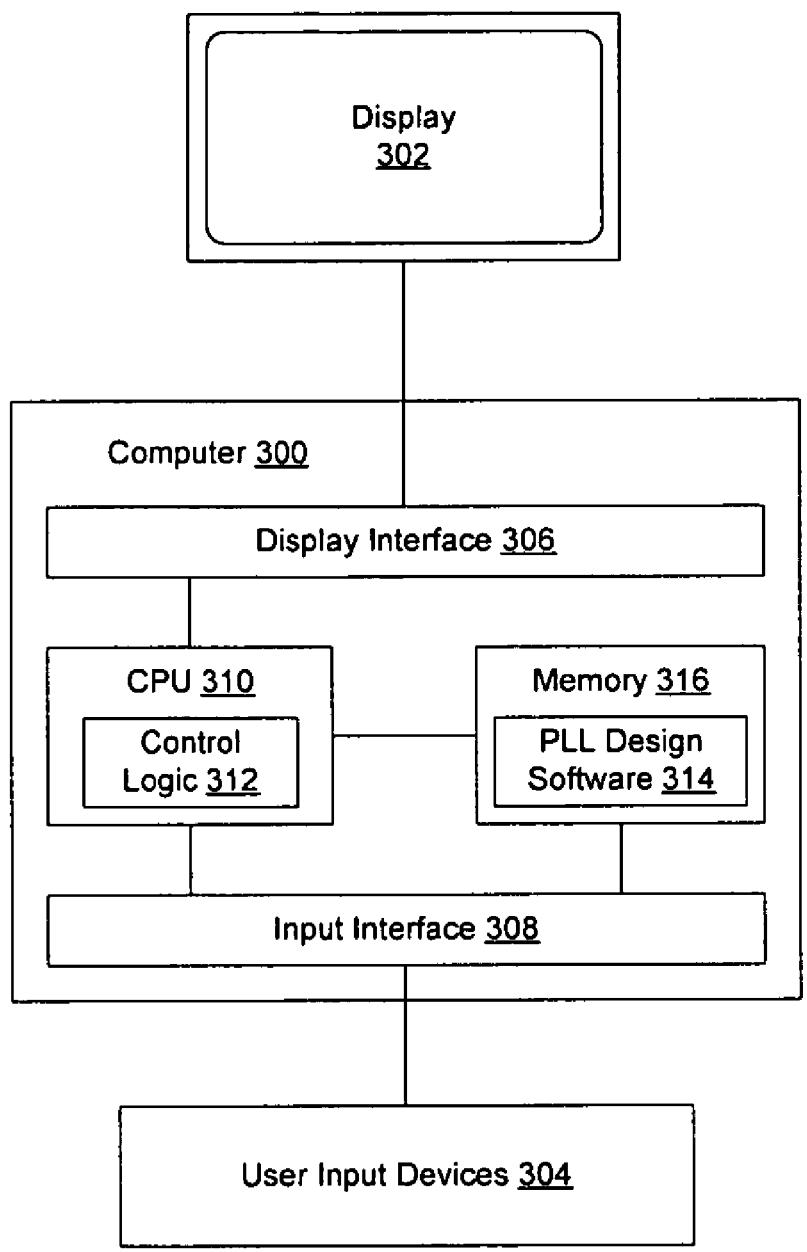
FIG. 16 is a functional block diagram of a computer system configured to run PLL design software configured according to an embodiment of the invention.

FIG. 16 shows a process that may be implemented in the PLL design software to enable a second or third order PLL to be designed. Initially, when the software starts (200) the software will prompt the user to input component characteristics for an initial selected set of components (202). The user will also be prompted, at this stage, to input design specifications of the PLL to be designed (204). Inputting design specifications and selected components may occur simultaneously or in any desired order and the invention is not limited to the particular sequence shown in FIG. 15.

Once the initial information has been entered, either manually by an user or automatically by another piece of software, the PLL design software will compute the time constants for a loop filter that would be required to enable the PLL top meet the design specifications given the selected components (206). These time constants may then be used to determine the PLL behavior characteristics, such as the stability of the system. (208). If the PLL behavior characteristics are satisfactory, the PLL design is complete (212). If not, the PLL design software may use the values of the time constants to help the user select different components that are more likely to produce a PLL with desirable behavior characteristics (214). For example, the PLL design software may indicate that the DAC does not have high enough resolution, or that a different VCO may work better given the desired PLL design specifications.

FIG. 16 shows a computer system that may be used to implement the PLL design software according to an embodiment of the invention. The computer system may be a standard computer and the invention is not limited to any particular type of computer system. In the embodiment shown in FIG. 16, the computer 300 is connected to a display 302 for displaying results and one or more user input devices 304. The user input devices may be stand-alone devices such as a keyboard or mouse, or may be integrated into the display, such as where the display is touch or light sensitive. The invention is not limited to the particular types of display and user input devices to be used with the computer.

The computer includes a display interface 306 and an input interface 308 to receive and transmit signals from the display and user input devices. The computer also includes a CPU 310 configured to implement control logic 312 so that the computer may perform the calculations described above to enable PLL design software 314 stored in memory 316 to be executed on the computer 300. A computer generally has many additional components that are not shown in this figure, as would be known to a person of ordinary skill in the art. The invention is not limited to the particular implementation shown in FIG. 16, but rather may be implemented on many differently configured computer platforms.

Once a PLL has been designed, it may be implemented using discrete components, integrated circuitry, or using a combination of hardware and control logic implemented as a set of program instructions that are stored in a computer readable memory within the network element and executed on a microprocessor. However, it will be apparent to a skilled artisan that all logic described herein can be embodied using discrete components, integrated circuitry, programmable logic used in conjunction with a programmable logic device such as a Field Programmable Gate Array (FPGA) or microprocessor, or any other device including any combination thereof. Programmable logic can be fixed temporarily or permanently in a tangible medium such as a read-only memory chip, a computer memory, a disk, or other storage medium. All such embodiments are intended to fall within the scope of the present invention.

It should be understood that all functional statements made herein describing the functions to be performed by the methods of the invention may be performed by software programs implemented utilizing subroutines and other programming techniques known to those of ordinary skill in the art. It also should be understood that various changes and modifications of the embodiments shown in the drawings and described in the specification may be made within the spirit and scope of the present invention. Accordingly, it is intended that all matter contained in the above description and shown in the accompanying drawings be interpreted in an illustrative and not in a limiting sense. The invention is limited only as defined in the following claims and the equivalents thereto.

What is claimed is:

1. A computer program product stored on a computer readable medium, the computer program product containing control logic which, when loaded into a computer processor, causes the processor to perform a method of designing a timestamp-based third-order Phase Locked Loop (PLL) for clock synchronization in a packet network, the PLL including a loop filter, a Digital to Analog Converter (DAC), and an oscillator, the method comprising the steps of:

specifying a center frequency of the oscillator, a register length of the of the DAC, and a desired damping factor of the PLL;

computing, a gain coefficient of the PLL and a natural frequency of the PLL; and determining from the gain coefficient and the natural frequency, a set of required time constants for the loop filter that will enable the PLL to have the specified damping factor.

2. The computer program product of claim 1, wherein the PLL is designed in two frequency domains.

3. The computer program product of claim 2, wherein the first and second frequency domains are related via a mapping factor.

4. The computer program product of claim 3, wherein the mapping factor is based on a nominal interval between receipt of timestamps.

5. The computer program product of claim 1, wherein the PLL is configured to receive timestamps and use the timestamps to synchronize with a master clock.

6. The computer program product of claim 5, wherein the PLL has a first frequency domain associated with the frequency of the local oscillator, and a second frequency domain associated with a nominal timestamp arrival frequency.

7. The computer program product of claim 6, wherein the first frequency domain is a control frequency domain, wherein the second frequency domain is an error measurement frequency domain, the method further comprising the step of accounting for a difference in the first frequency domain and the second frequency domain by using in part a magnitude of a nominal sampling interval.

8. The computer program product of claim 7, wherein the magnitude of the nominal sampling interval is based on an average timestamp arrival interval.

9. The computer program product of claim 1, further comprising the step of determining adaptively an optimal nominal DAC setting to enable a DAC offset computed during operation to be as small as possible.

10. The computer program product of claim 1, further comprising determining, from the time constants, PLL performance characteristics.

11. The computer program product of claim 10, wherein the PLL performance characteristics comprise PLL stability characteristics.

12. A computer program product stored on a computer readable medium, the computer program product containing control logic which, when loaded into a computer processor, causes the processor to perform a method of designing a third-order timestamp-based Phase Locked Loop (PLL) for clock synchronization in a packet network, the PLL including a loop filter, a Digital to Analog Converter (DAC), and an oscillator, the method comprising the steps of:

specifying a center frequency of the oscillator, a register length of the DAC, and a desired damping factor of the PLL;

specifying a phase margin for the PLL;

computing, the gain coefficient of the PLL and a natural frequency of the PLL;

determining a transfer function of the loop filter by:

computing a first time constant of the loop filter from the phase margin and the natural frequency;

computing a second time constant from the natural frequency and the first time constant; and computing a third time constant from the gain, the natural frequency, and the first and second time constants;

wherein the first, second, and third time constants are computed to enable the PLL to have the desired specified damping factor.

13. The computer program product of claim 12, wherein the local oscillator is a voltage controlled oscillator.

14. Computer software stored on a computer readable medium and containing control logic which, when loaded into a computer processor, enables the computer processor to be configured to aid in the design of a third-order Phase Locked Loop (PLL), said PLL comprising a phase detector, a loop filter, a digital to analog converter, and a local oscillator, the computer software comprising:

control logic configured to enable component characteristics of an initial selected set of components to be specified, said initial selected set of components comprising at least the phase detector, the digital to analog converter, and the local oscillator;

control logic configured to enable design specifications of the PLL to be specified, said design specifications comprising at least a desired damping factor of the PLL;

control logic configured to compute time constants for the loop filter that would be required to enable the PLL to meet the specified design specifications given the specified components characteristics; and control logic configured to determine, from the time constants, PLL behavior characteristics for a PLL constructed using a loop filter having those time constants and the initial set of components.

15. The computer software of claim 14, further comprising control logic configured to use values of the time constants to select different components for the PLL that are more likely to provide the PLL with better behavior characteristics.

16. The computer software of claim 14, further comprising control logic configured to compute a gain coefficient of the PLL and a natural frequency of the PLL.

17. The computer software of claim 16, wherein the control logic configured to compute time constants is configured to compute a first time constant of the loop filter from the phase margin and the natural frequency of the PLL;

compute a second time constant from the natural frequency and the first time constant; and compute a third time constant from the gain, the natural frequency, and the first and second time constants;

wherein the first, second, and third time constants are computed to enable the PLL to have the desired specified damping factor.

18. The computer software of claim 14, wherein the PLL is configured to receive timestamps and use the timestamps to synchronize with a master clock.

19. The computer software of claim 18, wherein the PLL has a first frequency domain associated with the frequency of the local oscillator, and a second frequency domain associated with a nominal timestamp arrival frequency.

20. The computer software of claim 19, wherein the first frequency domain is a control frequency domain, wherein the second frequency domain is an error measurement frequency domain, the computer software further comprising control logic configured to account for a difference in the first frequency domain and the second frequency domain by using in part a magnitude of a nominal sampling interval.

21. The computer software of claim 14, further comprising control logic configured to determine adaptively an optimal nominal DAC setting which enables a DAC offset computed during operation to be as small as possible.

* * * * *